(12) United States Patent
Lan et al.

(10) Patent No.: US 11,652,468 B2
(45) Date of Patent: May 16, 2023

(54) HIGH PERFORMANCE TUNABLE FILTER

(71) Applicant: QUALCOMM Incorporated, San Diego, CA (US)

(72) Inventors: Je-Hsiung Lan, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 318 days.

(21) Appl. No.: 16/922,471

(22) Filed: Jul. 7, 2020

(65) Prior Publication Data

US 2022/0014176 A1 Jan. 13, 2022

(51) Int. Cl.
*H03H 9/46* (2006.01)
*H03H 9/02* (2006.01)

(52) U.S. Cl.
CPC ..... *H03H 9/46* (2013.01); *H03H 2009/02165* (2013.01); *H03H 2009/02322* (2013.01)

(58) Field of Classification Search
CPC .......... H03H 9/46; H03H 2009/02165; H03H 2009/02322; H03H 7/487; H03H 7/0115; H03H 7/0123; H03H 7/0153; H01L 23/5223; H01L 23/76898; H01L 23/5227; H01L 23/481

See application file for complete search history.

(56) References Cited

U.S. PATENT DOCUMENTS

| | | | |
|---|---|---|---|
| 2014/0327496 A1* | 11/2014 | Zuo | H03H 3/00 333/132 |
| 2015/0092314 A1* | 4/2015 | Kim | H01F 27/40 361/270 |
| 2015/0304059 A1 | 10/2015 | Zuo et al. | |
| 2016/0225694 A1* | 8/2016 | Barth | H01L 23/481 |
| 2016/0301376 A1 | 10/2016 | Williams | |
| 2017/0187345 A1* | 6/2017 | Yun | H03H 7/463 |
| 2018/0026666 A1 | 1/2018 | Yun et al. | |

OTHER PUBLICATIONS

International Search Report and Written Opinion—PCT/US2021/033139—ISA/EPO—dated Dec. 13, 2021.
Partial International Search Report—PCT/US2021/033139—ISA/EPO—dated Aug. 18, 2021.

* cited by examiner

*Primary Examiner* — Jeffrey M Shin
(74) *Attorney, Agent, or Firm* — Qualcomm Incorporated

(57) ABSTRACT

Disclosed is a gallium arsenide (GaAs) enabled tunable filter for, e.g., 6 GHz Wi-Fi RF Frontend, with integrated high-performance varactors, metal-insulator-metal (MIM) capacitors, and 3D solenoid inductors. The tunable filter comprises a hyper-abrupt variable capacitor (varactor) high capacitance tuning ratio. The tunable filter also comprises a GaAs substrate in which through-GaAs-vias (TGV) are formed. The varactor along with the MIM capacitors and the 3D inductors is formed in an upper conductive structure on upper surface of the GaAs substrate. Lower conductive structure comprising lower conductors is formed on lower surface of the GaAs substrate. Electrical coupling between the lower and upper conductive structures is provided by the TGVs. The tunable filter can be integrated with radio frequency front end (RFFE) devices.

32 Claims, 27 Drawing Sheets

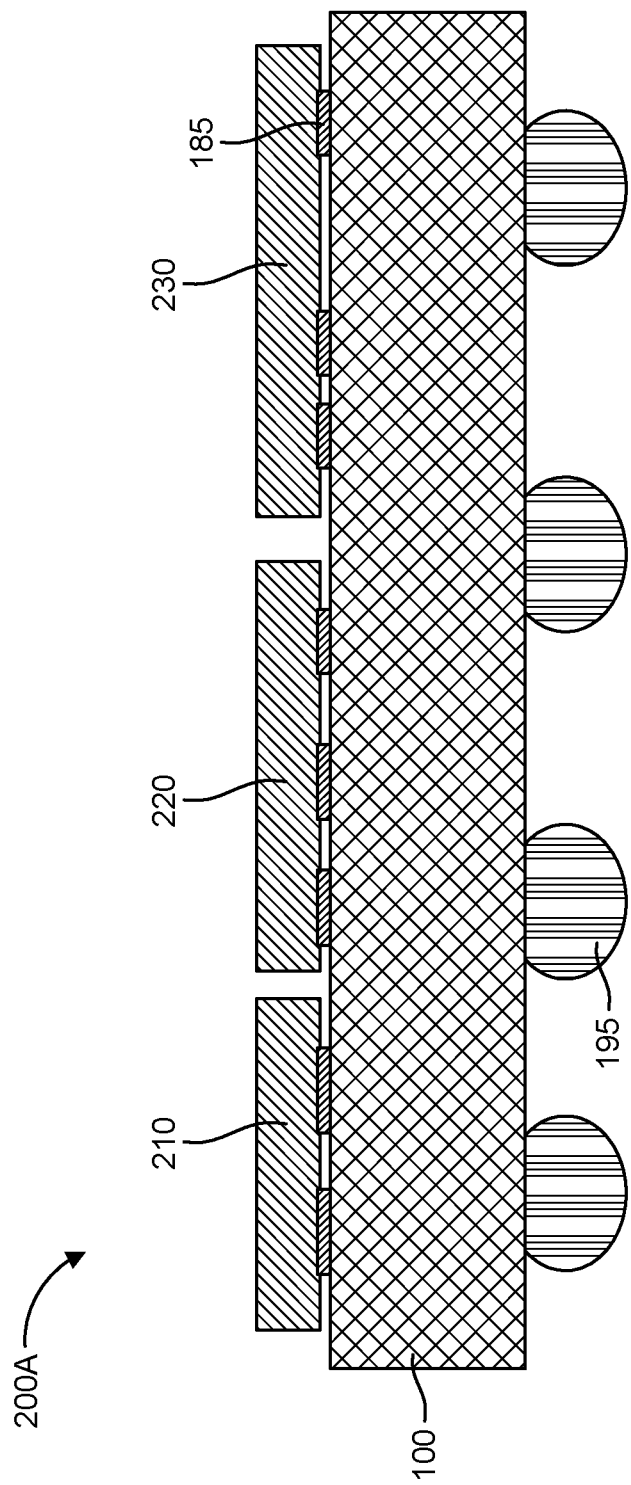

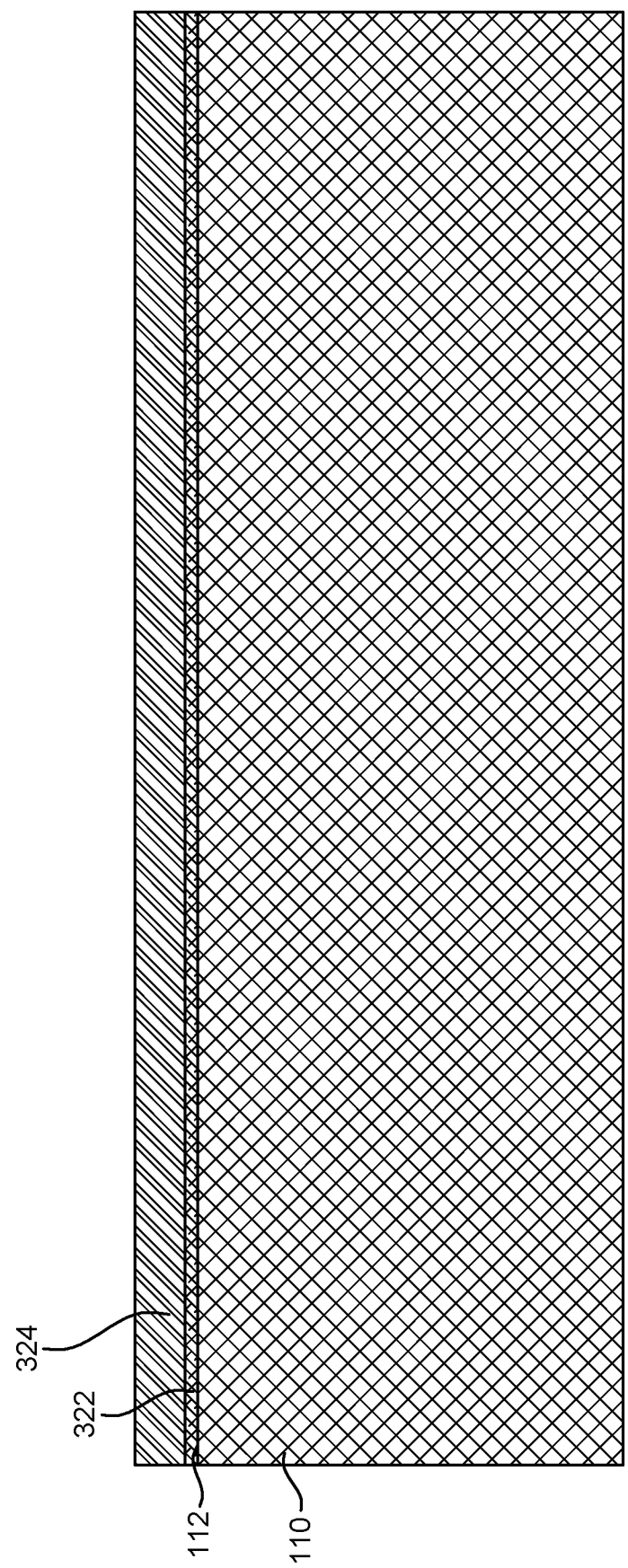

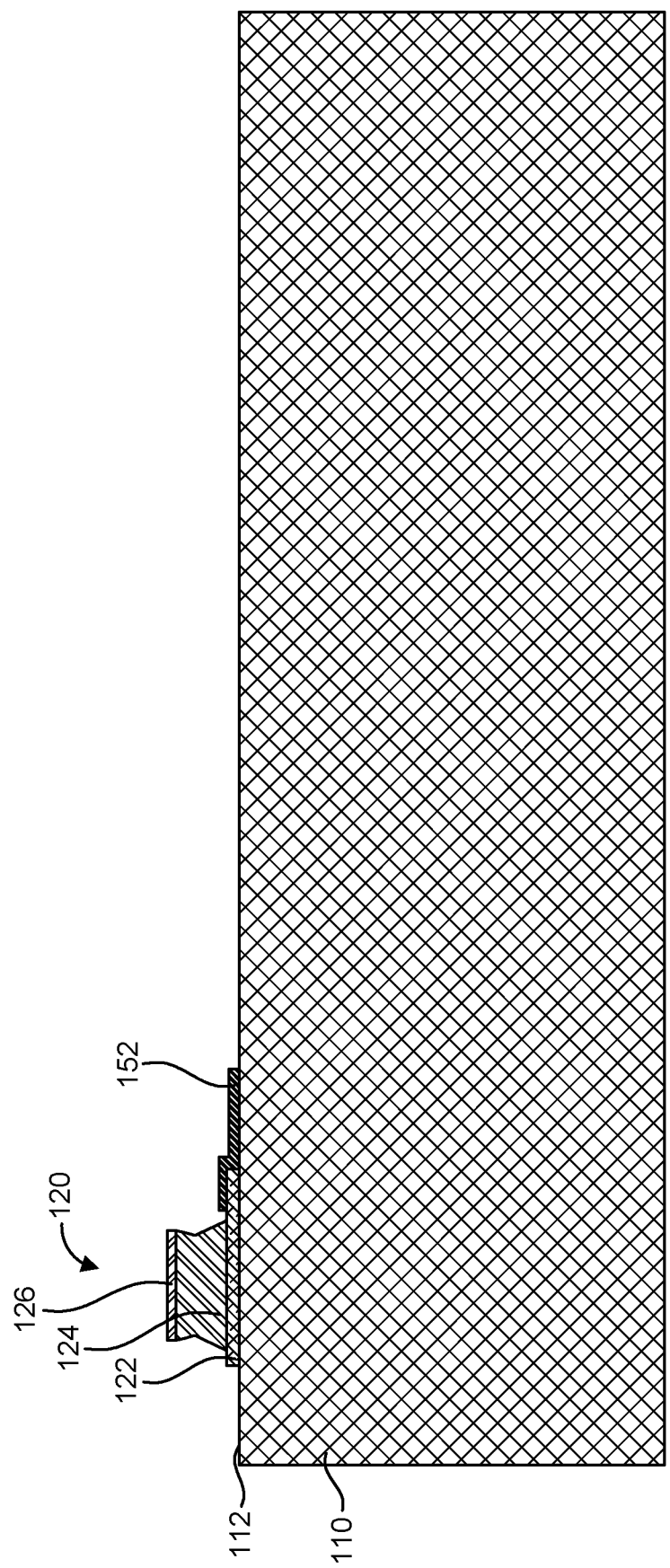

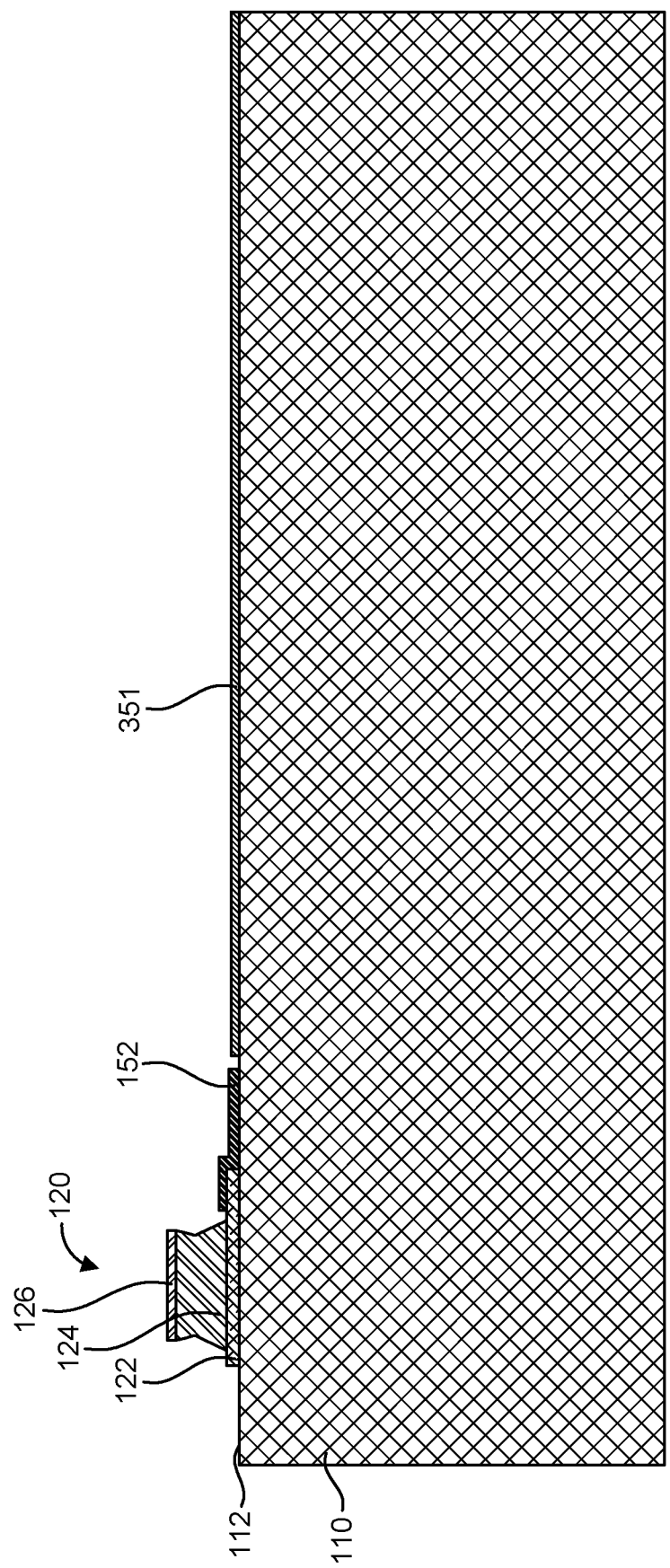

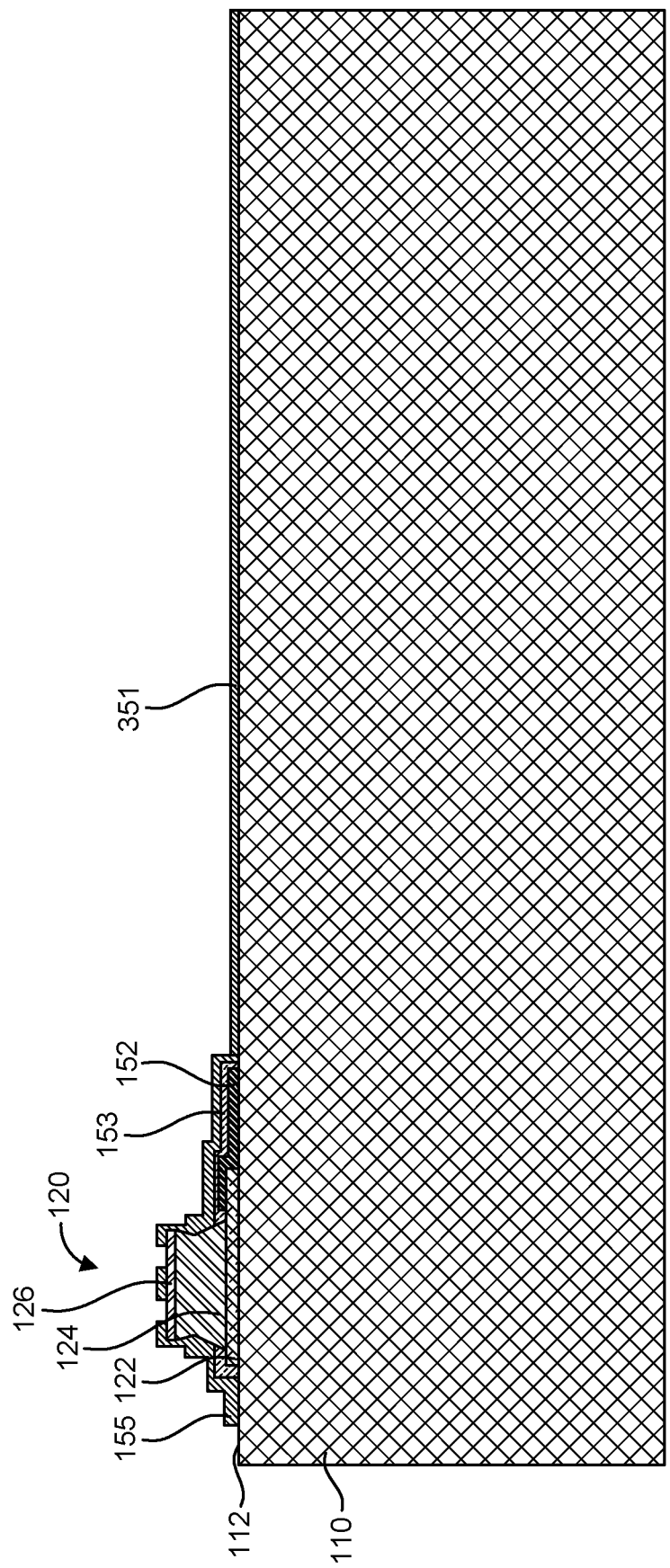

HIGH PERFORMANCE TUNABLE FILTER

FIELD OF DISCLOSURE

This disclosure relates generally to antenna, and more specifically, but not exclusively, to a high performance tunable filter and fabrication techniques thereof.

BACKGROUND

Integrated circuit technology has achieved great strides in advancing computing power through miniaturization of active components. The package devices can be found in many electronic devices, including processors, servers, radio frequency (RF) integrated circuits, etc. Packaging technology becomes cost-effective in high pin count devices and/or high production volume components.

Tunable filter with variable capacitor (varactor), which is a voltage controlled capacitor, is desirable for both cellular and Wi-Fi communications in its RF front end (RFFE) applications to cover multiple bands and multiple frequencies. Varactors with large Cmax/Cmin tuning ratio (TR), good isolation, linearity, and Q-factor, as well as high power handling capability are among the key performance indicators (KPI) for technology benchmark.

For high performance varactor device with RF KPI, there have been few technology choices for RFFE considerations. For example, silicon-on-insulator (SOI) and microelectromechanical systems (MEMS) varactors on Si substrate and MEMS varactor on glass substrate have been developed. MEMS varactor shows high tuning capability (e.g., TR>8). Unfortunately, it requires a high voltage charge pump (e.g., >20 V) for capacitor tuning.

High-Q 3D through-substrate via (TSuV) inductor built on low-loss and high thermally-conductive substrate is also desirable for the RF filters used in the TX path, that not only allows for low insertion loss but also enables high-power handling capability. Among the available 3D TSuV substrates, neither Si nor glass can meet both high-Q and high-power handling requirements. Sapphire or alumina can be used as substrate. However, their low TSuV etch rate using traditional photolithography (batch process) means that sequential laser scan/drill process is used resulting in low throughput.

Accordingly, there is a need for systems, apparatus, and methods that overcome the deficiencies of conventional tunable filter packages including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary tunable filter is disclosed. The tunable filter may comprise a gallium arsenide (GaAs) substrate. The tunable filter may also comprise a variable capacitor (varactor) disposed on an upper surface of the GaAs substrate. The tunable filter may further comprise an upper conductive structure disposed on the upper surface of the GaAs substrate. The upper conductive structure may comprise one or more upper conductors and one or more upper insulators configured to form one or more passive components that includes including a metal-insulator-metal (MIM) capacitor and a 3D inductor. The tunable filter may yet comprise one or more through-GaAs-vias (TGV) disposed through the GaAs substrate from the upper surface to a lower surface of the GaAs substrate. The tunable filter may yet further comprise a lower conductive structure disposed on the lower surface of the GaAs substrate. The lower conductive structure may comprise one or more lower conductors and one or more lower insulators configured to form a lower redistribution layer (RDL). The varactor, the MIM capacitor, and the 3D inductor are electrically coupled to form a radio frequency (RF) filter circuit.

An exemplary apparatus is disclosed. The apparatus may comprise a tunable filter and one or more radio frequency front end (RFFE) devices configured to control the tunable filter when electrically coupled to the tunable filter. The tunable filter may comprise a gallium arsenide (GaAs) substrate. The tunable filter may also comprise a variable capacitor (varactor) disposed on an upper surface of the GaAs substrate. The tunable filter may further comprise an upper conductive structure disposed on the upper surface of the GaAs substrate. The upper conductive structure may comprise one or more upper conductors and one or more upper insulators configured to form one or more passive components that includes including a metal-insulator-metal (MIM) capacitor and a 3D inductor. The tunable filter may yet comprise one or more through-GaAs-vias (TGV) disposed through the GaAs substrate from the upper surface to a lower surface of the GaAs substrate. The tunable filter may yet further comprise a lower conductive structure disposed on the lower surface of the GaAs substrate. The lower conductive structure may comprise one or more lower conductors and one or more lower insulators configured to form a lower redistribution layer (RDL). The varactor, the MIM capacitor, and the 3D inductor are electrically coupled to form a radio frequency (RF) filter circuit.

A method of fabricating a tunable filter is disclosed. The method may comprise forming a variable capacitor (varactor) on an upper surface of a GaAs substrate. The method may also comprise forming an upper conductive structure on the upper surface of the GaAs substrate. The upper conductive structure may comprise one or more upper conductors and one or more upper insulators configured to form one or more passive components that includes including a metal-insulator-metal (MIM) capacitor and a 3D inductor. The method may further comprise forming one or more through-GaAs-vias (TGV) through the GaAs substrate from the upper surface to a lower surface of the GaAs substrate. The method may yet comprise forming a lower conductive structure on the lower surface of the GaAs substrate. The lower conductive structure may comprise one or more lower conductors and one or more lower insulators configured to form a lower redistribution layer (RDL). The varactor, the MIM capacitor, and the 3D inductor are electrically coupled to form a radio frequency (RF) filter circuit.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 2A-2B illustrate example integration of one or more tunable filters with radio frequency front end devices in accordance with at one or more aspects of the disclosure.

FIGS. 3A-3G, 4A-4F, and 5A-5F illustrate examples stages of fabricating a tunable filter in accordance with at one or more aspects of the disclosure.

Figure 1:
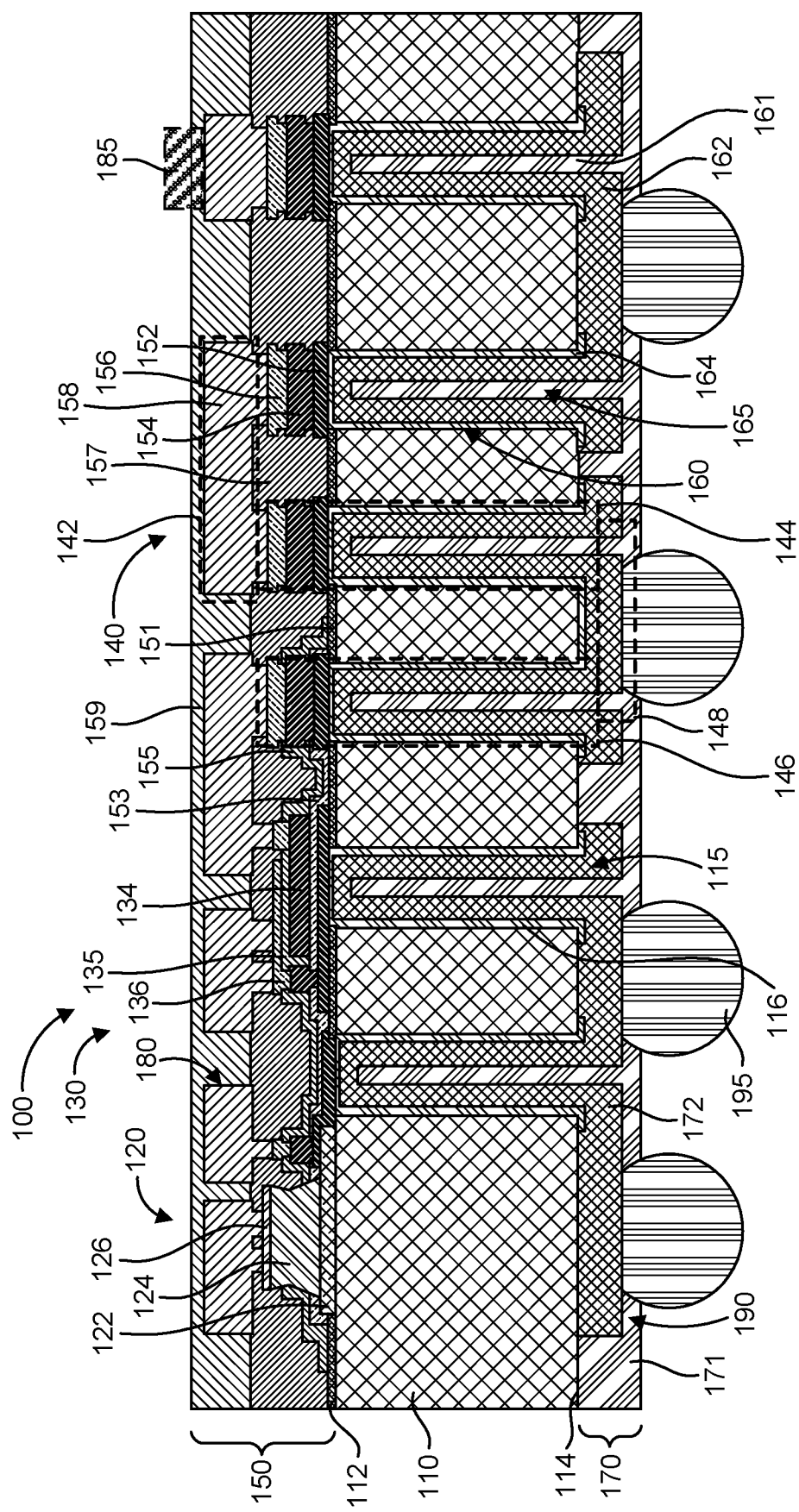
FIG. 1 illustrates an example tunable filter in accordance with at one or more aspects of the disclosure.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In accordance with the various aspects disclosed herein, to address issues associated with conventional tunable filters, a novel tunable filter with high performance gallium arsenide (GaAs) hyper-abrupt junction varactors, metal-insulator-metal (MIM) capacitors, and 3D solenoid inductors through-GaAs substrate via (TGV) is proposed. The proposed tunable filter may be used in applications such as RFFE at very high frequencies, e.g., 6 GHz. The proposed tunable filter allows for high-Q (HQ) and high tuning ratio (HTR) tunable resonator/filter devices to integrate with various CMOS/silicon drivers and controllers and RFFE devices, such as CMOS charge pumps, low noise amplifiers (LNA), switches, etc.

Some of the distinct features of the proposed tunable filters include:
  GaAs enabled tunable filter for, e.g., 6 GHz Wi-Fi RF Frontend, with integrated high-performance varactors, MIM capacitors, and solenoid inductors;
  GaAs hyper-abrupt junction varactor with high capacitance tuning ratio (e.g., HTR: Cmax/Cmin>4);
  HQ 3D solenoid inductor built on low-loss thermally-conductive GaAs substrate with mature high-throughput through-GaAs-via (TGV) technology;
  HQ and HTR resonator of hyper-abrupt junction varactor built on top of TGV inductors;
  CMOS charge pumps (CHP), controllers, LNA, and switch chips with die-to-wafer (D2W) integration to tunable RF filters;
  High power handling for filters in the TX path with good thermal conductive GaAs substrate;
  Integration schemes with key RFFE devices: (i) Interposer like approach, (ii) "CIL" like approach.

FIG. 1 illustrates an example tunable filter 100 in accordance with one or more aspects of the disclosure. The tunable filter 100 may comprise a GaAs substrate 110, an upper conductive structure 150 above the GaAs substrate 110, and a lower conductive structure 170 below the GaAs substrate 110. It should be noted that terms or phrases such as "lower", "upper", "left", "right", "below", "above", "horizontal, "vertical", etc. are used for convenience. Unless otherwise specifically indicated, such terms/phrased are not intended to indicate absolute orientations or directions. Also, while GaAs is used for descriptive purposes, it is contemplated that other iii-v compounds may be used as well.

Briefly, components (e.g., GaAs varactor 120, MIM capacitor 130, 3D inductor 140, etc.) may be formed in the upper conductive structure 150, the lower conductive structure 170 serve as a redistribution layer and provide connectivity to external devices, and the GaAs substrate 110 may provide electrical coupling between the upper and lower conductive structures 150, 170.

A GaAs variable capacitor (varactor) 120, which is a capacitor whose capacitance is controllable through application of voltage, may be formed in the upper conductive structure 150. The illustrated GaAs varactor 120 may comprise a GaAs buffer layer 122, a GaAs active layer 124, and a varactor contact 126. The GaAs buffer layer 122 is disposed on the upper surface 112 of the GaAs substrate 110. That is, the GaAs buffer layer 122 can be in contact with the GaAs substrate 110. The GaAs buffer layer 122 can be n+ doped.

The GaAs active layer 124, which can be n doped, may be disposed on the GaAs buffer layer 122. The GaAs active layer 124 can be hyper-abrupt. Thus, the GaAs varactor 120 may also be referred to as hyper-abrupt (HA) GaAs varactor. The GaAs active layer 124 can take on mesa shape. The varactor contact 126 may be disposed on the GaAs active layer 124. In an aspect, the varactor contact 126 can be a Schottky contact.

Note that the GaAs active layer 124 does not totally cover the GaAs buffer layer 122. An ohmic contact (an upper contacts of the upper conductive structure 150, explained further below) may be formed on a portion of the GaAs buffer layer 122 not covered the GaAs active layer 124. The ohmic contact can serve as a cathode contact, implying that the varactor contact 126 can serve as an anode contact. As seen, the GaAs varactor 120 may be encapsulated by one or more upper insulators of the upper conductive structure 150 (also further explained below). While one GaAs varactor 120 is illustrated, any number of GaAs varactors 120 may be formed.

The GaAs substrate 110 may include one or more through-GaAs-vias (TGV) 160 formed in one or more vias 115, which are holes, within the GaAs substrate 110. The TGVs 160, which are conducive, may extend the entire height of the GaAs substrate 110, i.e., from the upper surface 112 to the lower surface 114. The TGVs 160 may be configured to electrically couple one or more of the GaAs varactor 120, the MIM capacitor 130, and the 3D inductor 140 with the lower RDL 190 formed in the lower conductive structure 170.

Each TGV 160 may comprise a conductive pillar 162 that fills a corresponding via 115 and may extend from upper to lower surfaces 112, 114 within the via 115. The conductive pillar 162 may be formed from copper (Cu), silver (Ag), gold (Au), aluminum (Al), tungsten (W), nickel (Ni), or combinations thereof. In an aspect, the conductive pillar 162 and the lower RDL 190 of the lower conductive structure 170 may be formed from same material(s). Indeed, they may be integrally formed.

Each TGV 160 may also comprise a conductive layer 164 disposed vertically on walls 116 of the vias 115 such that the conductive pillar 162 is disposed on and interior of the conductive layer 164 within the via 115. The conductive layer 164 may also be disposed horizontally in between the corresponding conductive pillar 162 and one of the first upper conductors 152 of the upper conductive structure 150. Alternatively or in addition thereto, the conductive layer 164 may be disposed horizontally in between the lower surface 114 of the GaAs substrate 110 and the lower RDL 190 formed in the lower conductive structure 170. The conductive layer 164 for GaAs substrate may be formed by plating TiW seed layer, followed by gold (Au), copper (Cu), or combinations thereof. The first conductive layer 164 of Au may be generally used in the GaAs manufacturing line. When it is not provided, the conductive pillar 162 may be disposed on the wall 116 and on the first upper conductor 152.

Note that the TGVs 160, and in particular the conductive pillars 162, may also have central cavities 165 that are filled with insulating plugs 161. The insulating plugs 161 may extend from below the lower surface 114 but not quite reach the upper surface 112 of the GaAs substrate 110. That is, the insulating plugs 161 may extend from below the lower surface 114 to below the upper surface 112. In an aspect, the insulating plug 161 and lower insulators 171 of the lower conductive structure 170 may be formed from same material(s). Indeed, they may be integrally formed.

The lower conductive structure 170, which may be disposed on the lower surface 114 of the GaAs substrate 110, may comprise one or more lower conductors 172 and one or more lower insulators 171 configured to form the lower redistribution layer (RDL) 190. That is, the lower RDL 190 may comprise the one or more lower conductors 172. In an aspect, one or more lower conductive layers and one or more lower insulating layers may be patterned to form the lower RDL 190 comprising the one or more lower conductors 172.

The lower RDL 190, and hence the one or more lower conductors 172, may be disposed on the lower surface 114 of the GaAs substrate 110. The lower conductors 172 may be formed from copper (Cu), silver (Ag), gold (Au), aluminum (Al), or combinations thereof. Indeed, as indicated above, the lower RDL 190 and the conductive pillars 162 of the TGVs 160 may be formed from same material(s).

The one or more insulators 171 may be disposed on the lower surface 114 of the GaAs substrate 110 and on the lower RDL 190 (i.e., on the lower conductors 172). The lower insulators 171 may be formed from any one or more of silicon dioxide (SiO$_2$), organic polymeric dielectric, polyimide (PI), polynorbornene, benzocyclobutene (BCB), polytetrafluoroethylene (PTFE), Polybenzoxazoles (PBO), silicone based polymeric dielectrics, or combinations thereof. Note that the insulating plugs 161 of the TGVs 160 may also be formed same materials.

In an aspect, one or more external connects 195 may be disposed on lower surfaces of some of the lower conductors 172. More generally, the external connects 195 may be disposed on the lower RDL 190. The external connects 195 may be configured to electrically couple the lower RDL 190 to one or more components that are external to the tunable filter 100. In this way, the external connects 195 may provide electrical coupling paths between the external components and the components—the GaAs varactor 120, the MIM capacitor 130, and/or the 3D inductor 140—of the tuning filter 100. The one or more external connects 195 may be any one or more of wafer-level-package (WLP) balls, copper (Cu) pillars, and solder bumps. In an aspect, the lower insulators 171 may be configured to encapsulate the one or more external connects 195 other than portions of the lower surface of the lower RDL 190 on which the one or more external connects 195 are disposed.

The upper conductive structure 150, which may be disposed on the upper surface 112 of the GaAs substrate 110, may comprise one or more upper conductors and one or more upper insulators, both of which can be configured to form passive components such as MIM capacitor(s) 130 and 3D inductor(s) 140. As indicated above, the GaAs varactor 120 may be formed within the upper conductive structure 150. The GaAs varactor 120, the MIM capacitor 130, and the 3D inductor 140 may be electrically coupled to form a radio frequency (RF) filter circuit.

In an aspect, multiple upper conductive layers may be patterned to form upper conductors. For example, as shown in FIG. 1, a first upper conductive layer may be patterned to form one or more first upper conductors 152, a second upper conductive layer may be patterned to form one or more second upper conductors 154, a third upper conductive layer may be patterned to form one or more third upper conductors 156, and a fourth upper conductive layer may be patterned to form one or more fourth upper conductors 158. This is an example, and the actual number of upper conductive layers need not be limited to four.

The conductive materials that make up each of the upper conductive layers (and therefore the upper conductors) may be varied. For example, each of the first through fourth upper conductors may be formed from copper (Cu), silver (Ag), gold (Au), aluminum (Al), or combinations thereof.

Similarly, multiple upper insulating layers may be patterned to form upper insulators. Again for example, as shown in FIG. 1, a first upper insulating layer may be patterned to form one or more first upper insulators 153, a second upper insulating layer may be patterned to form one or more second upper insulators 155, a third upper insulating layer may be patterned to form one or more third upper insulators 157, and a fourth upper insulating layer may be patterned to form one or more fourth upper insulators 159.

This is an example, and the actual number of upper insulating layers need not be limited to four. As an illustration of flexibility in the number of insulating layers, FIG. 1 also shows a zeroth upper insulating layer that may be patterned to form one or more zeroth upper insulators 151 disposed on the upper surface 112 of the GaAs substrate 110. If applied, the zeroth upper insulators 151 can help to mitigate leakage current. But even if the zeroth upper insulators 151 are not present, the disclosed tunable filter 100 will still function well. That is, the zeroth upper insulators 151 are optional.

The insulating materials that make up each of the upper insulating layers (and therefore the upper insulator) may be varied and may include dielectrics. For example, each of the first (or zeroth) through fourth upper insulators may be formed from silicon dioxide ($SiO_2$), organic polymeric dielectric, polyimide (PI), polynorbornene, benzocyclobutene (BCB), Polybenzoxazoles (PBO), polytetrafluoroethylene (PTFE), silicone based polymeric dielectrics, or combinations thereof.

One or more of the first upper conductors 152 may be disposed on corresponding one or more of the TGVs 160. Note that the first upper conductors 152 may be used to provide electrical connectivity to components within the upper conductive structure 150 to the TGVs 160. For example, one of the first upper conductors 152 may be configured to electrically couple the GaAs buffer layer 122 of the GaAs varactor 120 with one of the TGVs 160.

One or more of the second upper conductors 154 may be disposed on or over the corresponding one or more first upper conductors 152. That is, some second upper conductors 154 may be in contact with their corresponding first upper conductors 152. However, for some other second upper conductors 154, there may be first insulators 153 formed in between the first and second upper conductors 152, 154. In other words, one or more first upper insulators 153 may be disposed on their corresponding one or more first upper conductors 152. In an aspect, this may occur in an area of the upper conductive structure 150 where the MIM capacitor 130 is formed. When present, the first insulator 153 may prevent electrical coupling between the first and second upper conductors 152, 154.

One or more third upper conductors 156 may be disposed on or over the corresponding one or more second upper conductors 154. That is, some third upper conductors 156 may be in contact with their corresponding second upper conductors 154. For others, there may be second upper insulators 155 in between the second and third upper conductors 154, 156. That is, there may be one or more second upper insulators 155 disposed on their corresponding one or more second upper conductors 154. Again, this may occur in the area of the upper conductive structure 150 where the MIM capacitor 130 is formed. When present, the second upper insulator 155 may prevent electrical coupling between the second and third upper conductors 154, 156.

One or more fourth upper conductors 158 may be disposed on the one or more third upper conductors 156. In an aspect, the fourth upper conductors 158 may serve to as an upper RDL 180 to provide electrically coupling within the upper conductive structure 150. For example, the fourth upper conductors 158 may provide electrical paths to apply voltage to the GaAs varactor 120. Note that one of the fourth upper conductor 158 can be electrically coupled to the GaAs buffer layer 122 (cathode of the GaAs varactor 120), and another of the fourth upper conductor 158 can be electrically coupled to the varactor contact 126 (anode of the GaAs varactor 120).

One or more of the first upper insulators 153 may be disposed on the upper surface 112 of the GaAs substrate 110 or on the one or more zeroth upper insulators 151 if they are present. One or more second upper insulators 155 one or more first upper insulators 153 so as to passivate the GaAs varactor 120, at least in part. Also as indicated above, some first upper insulators 153 may be disposed in between first and second upper conductors 152, 154, and one or more second upper insulators 155 may be disposed in between second and third upper conductors 154, 156, e.g., in the area where the MIM capacitor 130 is formed.

One or more third upper insulators 157 may be formed by patterning a third upper insulating layer. The third upper insulators 157 may be disposed on or over the GaAs substrate to encapsulate the first, second, and third upper conductors 152, 154, 156. One or more fourth upper insulators 159 may be formed by patterning a fourth upper insulating layer. The fourth upper insulators 159 may be disposed on the fourth upper conductors 158 and on the third upper insulators 157. In an aspect, the fourth insulating layer may completely cover upper surfaces of the fourth upper conductors 158 electrically coupled to the MIM capacitor 130 and completely cover the fourth upper conductors 158 that form the 3D inductor 140.

In an aspect, one or more contact pads 185 may be disposed on one or more fourth upper conductors 158. The contact pads 185 may be exposed above the fourth insulating layer. More generally, the external connects 195 may be disposed on the lower RDL 190. The contact pads 185 may be configured to electrically couple the fourth upper conductors 158 to one or more components that are external to the tunable filter 100. In this way, the contact pads 185 may provide electrical coupling paths between the external components and the components—the GaAs varactor 120, the MIM capacitor 130, and/or the 3D inductor 140—of the tuning filter 100. The one or more contact pads 185 may be formed from copper (Cu), silver (Ag), gold (Au), aluminum (Al), tungsten (W), nickel (Ni), or combinations thereof.

The MIM capacitor 130 may comprise a lower plate 134, an upper plate 136, and a dielectric 135 disposed in between the lower and upper plates 134, 136. In an aspect, one of the second upper conductors 154 may serve as the lower plate 134, one of the second upper insulators 155 may serve as the dielectric 135, and one of the third upper conductors 156 may serve as the upper plate 134.

The MIM capacitor 130 may be electrically coupled to the GaAs varactor 120 and to the 3D inductor 140. In this particular instance, FIG. 1 illustrates the lower plate 134 being coupled to the GaAs varactor 120 and the upper plate being coupled to the 3D inductor 140. However, the reverse can also occur. That is, in general, one of the lower and upper plates 134, 136 may be electrically coupled to one of the GaAs varactor 120 and the 3D inductor 140, and the other of the lower and upper plates 134, 136 may be electrically coupled to the other of the GaAs varactor 120 and the 3D inductor 140.

So as to provide electrical integrity, note that one of the first upper insulators 153 can be disposed on and below the lower plate 134 such that the lower plate 134 does not contact any of the first upper conductors 152. While one MIM capacitor 130 is illustrated, there can be any number of MIM capacitors 130.

The 3D inductor 140 may comprise one or more loops. In an aspect, each loop of the 3D inductor 140 may comprise multiple loop segments—an upper horizontal loop segment 142, first and second vertical loop segments 144, 146, and a lower horizontal loop segment 148—highlighted with dashed boxes in FIG. 1. The upper horizontal loop segment 142 may comprises one of the fourth upper conductors 158, the first vertical loop segment 144 may comprises one of the TGVs 160, the second vertical loop segment 146 may comprises another one of the TGVs 160, and the lower horizontal loop segment 148 comprises one of the lower conductors 172 that make up the lower RDL 190. In this instance, the first and second vertical loop segments 144, 146 may also include their respectively corresponding first, second, and third upper conductors 152, 154, 156.

While one 3D inductor 140 is illustrated, there can be any number of 3D inductors 140. Also, while only one loop is illustrated, there can be any number of loops for the 3D inductor 140. Moreover, the number of loops for one 3D inductor 140 may be independent of the number of loops for another 3D inductor 140.

Figure 2B:
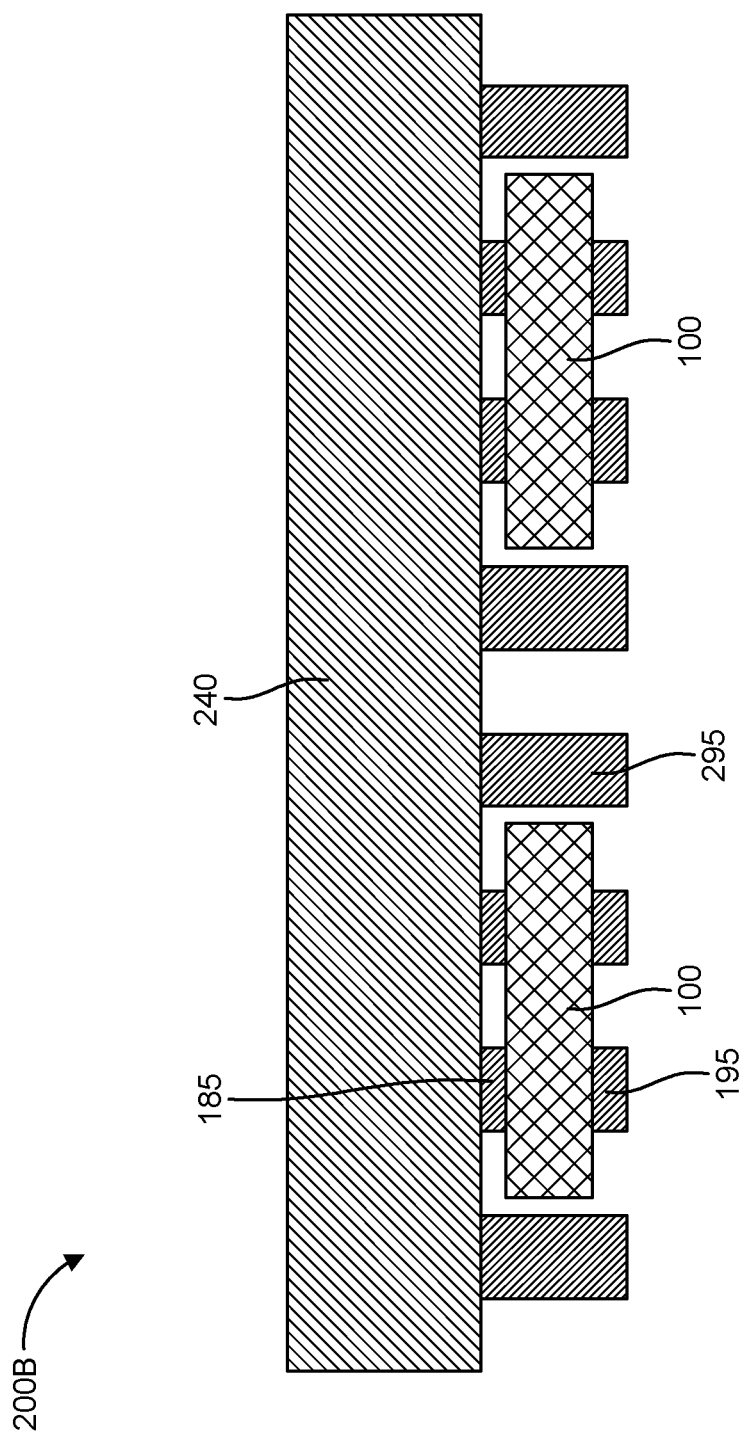

The tunable filter 100 may be integrated with one or more radio frequency front end (RFFE) devices as illustrated in FIGS. 2A and 2B. In these figures, the details of the tunable filter 100 are omitted for simplicity. When electrically coupled to the tunable filter 100, the RFFE devices may control the tunable filter 100. The RFFE devices may be fabricated as CMOS devices, and may include charge pump/controller 210, low noise amplifier (LNA) 220, switch 230, and so on. When the RFFE devices and the tunable filter 100 are integrated, the RFFE devices may be electrically coupled to any of the GaAs varactor 120, the MIM capacitor 130, and the 3D inductor 140 through the external connects 195 and/or the contact pads 185.

FIG. 2A illustrates an apparatus 200A that depicts an example result of an interposer-like approach to integration. In this approach, the individual RFFE devices—any one or more of the charge pump/controller 210, the LNA 220, the switch 230, etc.—may be electrically coupled to the tunable filter 100 through the one or more contact pads 185.

FIG. 2B illustrates an apparatus 200B that depicts an example result of CIL-like approach to integration. In this approach, individual RFFE functionalities may be combined into a single RFFE device 240. That is, the functionalities of the charge pump/controller 210, the LNA 220, the switch 230, etc.—can be combined in the single RFFE device 240. The single RFFE device 240 can be integrated with one or multiple tunable filters 100. That is, the single RFFE device 240 itself may be configured to electrically couple with multiple tunable filters 100.

FIGS. 3A-5F illustrate examples stages of fabricating a tunable filter in accordance with at one or more aspects of the disclosure. Broadly, FIGS. 3A-3G illustrate stages related to forming the GaAs varactor 120, FIGS. 4A-4F illustrate stages related to forming the passive components (MIM capacitor 130, 3D inductor 140), and FIGS. 5A-5F illustrate stages related to forming the TGVs 160 and the lower conductive structure 170. Forming the GaAs varactor 120 (FIGS. 3A-3G) and the passive components 130, 140 (FIGS. 4A-4F) may be referred to as front side processes, and forming the TGVs 160 and the lower conductive structure 170 (FIGS. 5A-5F) may be referred to as back side processes.

FIG. 3A illustrates a stage in which an n+ doped GaAs layer 322 may be deposited on the upper surface 112 of the GaAs substrate 110 and depositing an n doped GaAs layer 324 on the n+ doped GaAs layer 322. The n+ doped GaAs layer 322 and/or the n doped GaAs layer 324 may be epitaxial layers deposited through metal-organic chemical vapor deposition (MOCVD). The n doped GaAs layer 324 may be hyper-abrupt.

FIG. 3A illustrates a stage in which an n+ doped GaAs layer 322 may be deposited on the upper surface 112 of the GaAs substrate 110 and an n doped GaAs layer 324 may be deposited on the n+ doped GaAs layer 322. The n+ doped GaAs layer 322 and/or the n doped GaAs layer 324 may be epitaxial layers grown through metal-organic chemical vapor deposition (MOCVD). The n doped GaAs layer 324 may be hyper-abrupt.

Figure 3B:
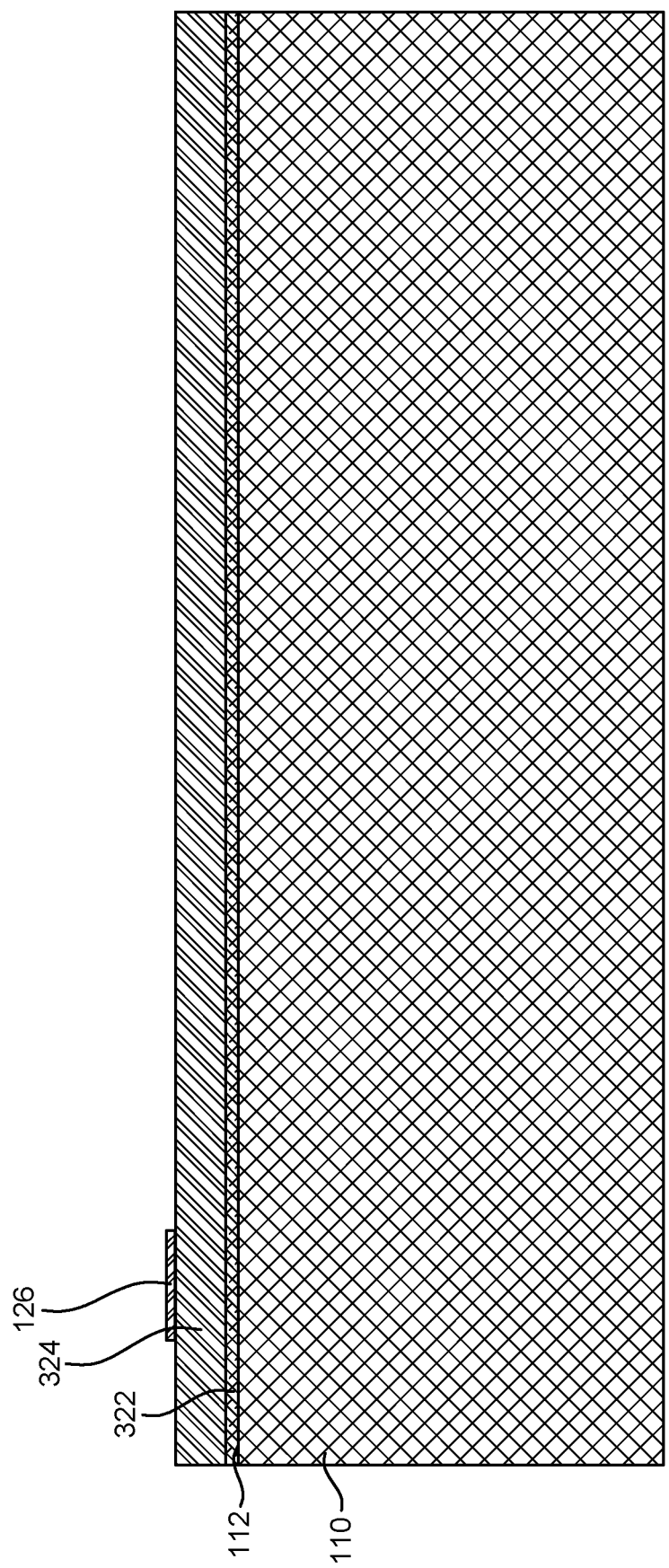

FIG. 3B illustrates a stage in which the varactor contact 126 may be formed on the n doped GaAs layer 324. The varactor contact 126 may be a Schottky contact.

Figure 3C:
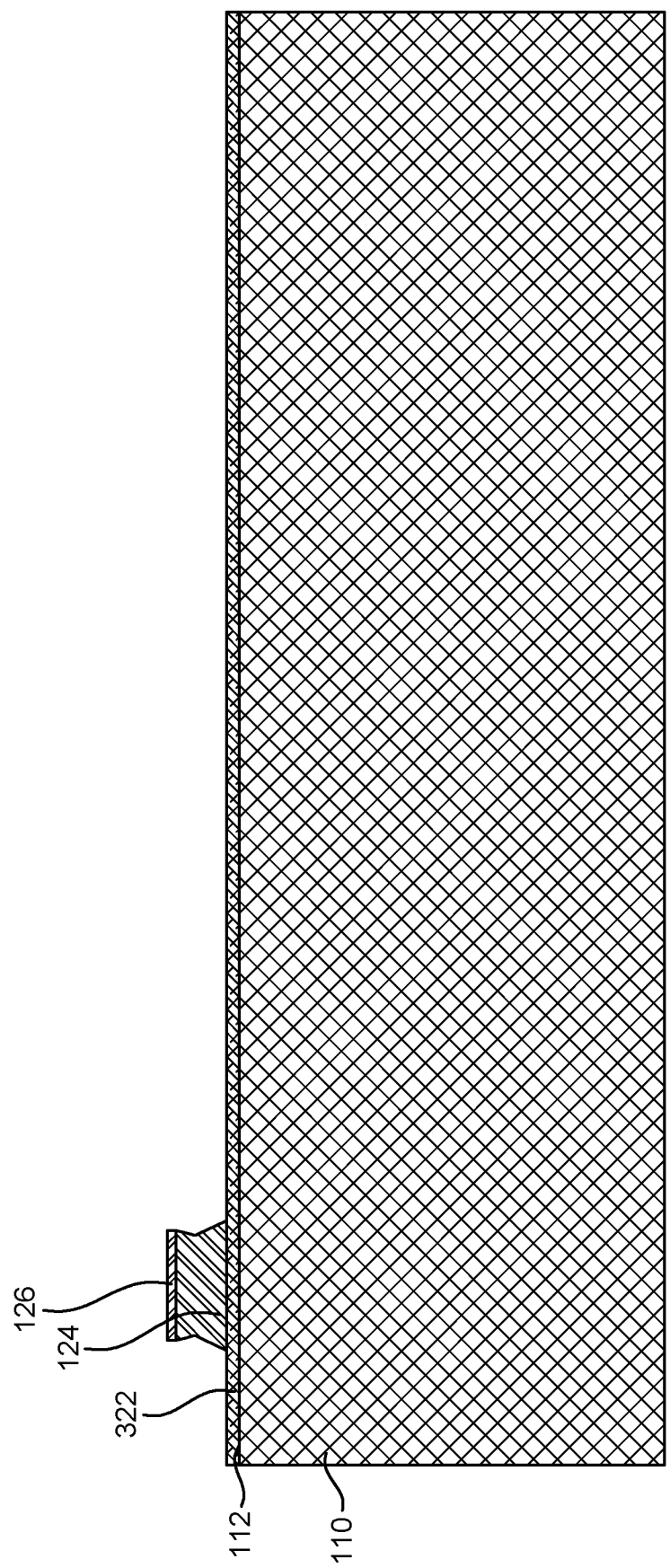

FIG. 3C illustrates a stage in which the n doped GaAs layer 324 is etched in a mesa shape to form the GaAs active layer 124.

Figure 3D:
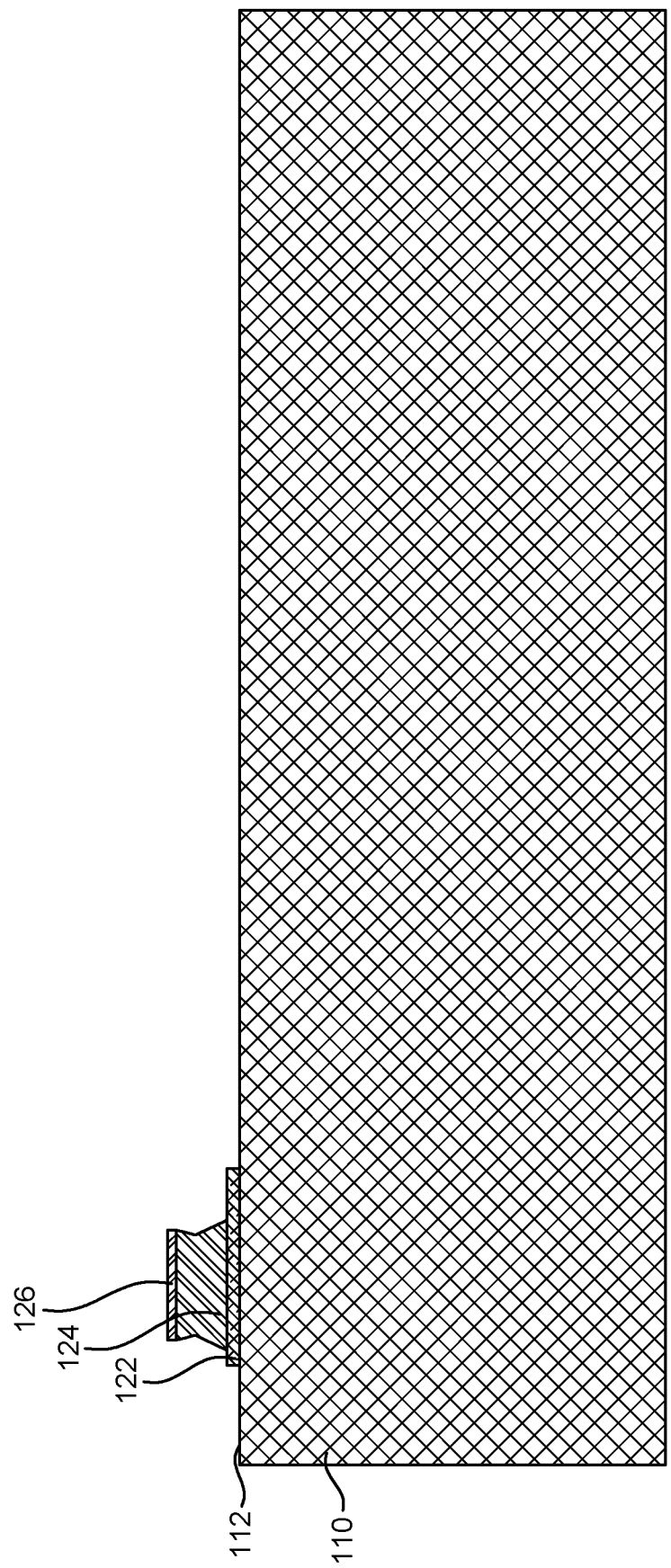

FIG. 3D illustrates a stage in which the n+ doped GaAs layer 322 is etched to form the GaAs buffer layer 122. The GaAs buffer layer 122 may be patterned for a cathode contact.

FIG. 3E illustrates a stage in which an ohmic contact may be formed on the GaAs substrate 110 and on the GaAs buffer layer 122. The ohmic contact may be one of the first upper conductor 152 of the upper conductive structure 150.

FIG. 3F is similar to FIG. 3E in that it illustrates a stage in which an ohmic contact may be formed on the GaAs substrate 110 and on the GaAs buffer layer 122. The difference is that in FIG. 3F, a zeroth insulating layer 351 may be deposited on the GaAs substrate 110. In an aspect, FIGS. 3E and 3F may be viewed as alternatives.

FIG. 3G illustrates a stage in which the GaAs varactor 120 may be passivated with one or more upper insulators, e.g., first and second upper insulators 153, 155, of the upper conductive structure 150. The zeroth insulating layer 351 is shown in FIG. 3G. Thus, FIG. 3G may be viewed as a subsequent stage to FIG. 3F. However, while not shown, the GaAs varactor 120 may be passivated as a subsequent stage to FIG. 3E in which the zeroth insulating layer 351 is not present.

Figure 4A:
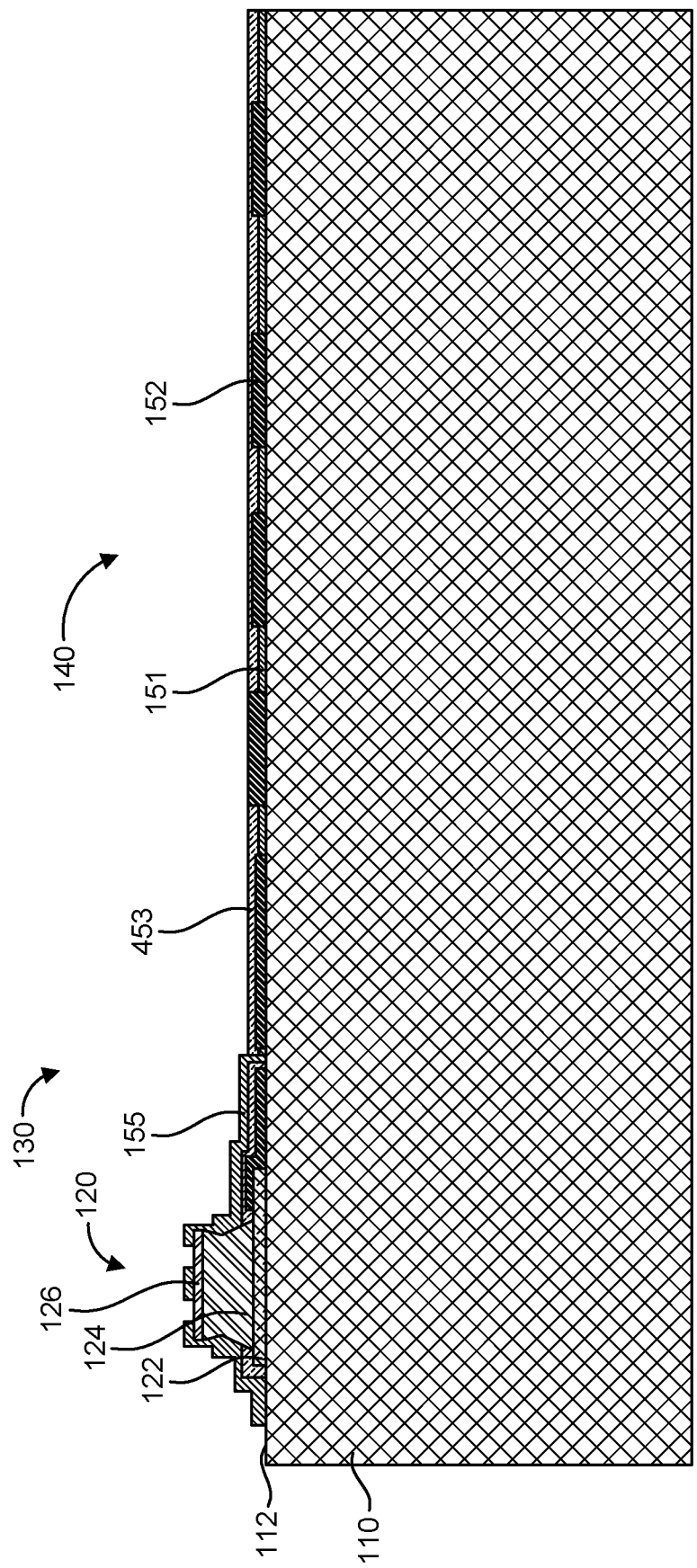

FIG. 4A illustrates a stage in which a first upper conductive layer may be deposited and patterned to form the first upper conductors 152 disposed on the upper surface 112 of the GaAs substrate 110. FIG. 4A also illustrates that a first upper insulating layer 453 (e.g., a dielectric layer) may be deposited over to fill spaces horizontally in between the first upper conductors 152.

FIG. 4A shows that the zeroth insulating layer 351 may be patterned to form the zeroth insulators 151 disposed on the GaAs substrate 120 horizontally in between the first upper conductors 152, and the first upper insulating layer 453 (patterned to form first upper insulators 153) may be disposed on the zeroth insulators 151. In an alternative, when the zeroth insulators 151 are not present, the first upper insulating layer 453 may be disposed on the GaAs substrate 120 horizontally in between the first upper conductors 152 (not shown).

Figure 4B:
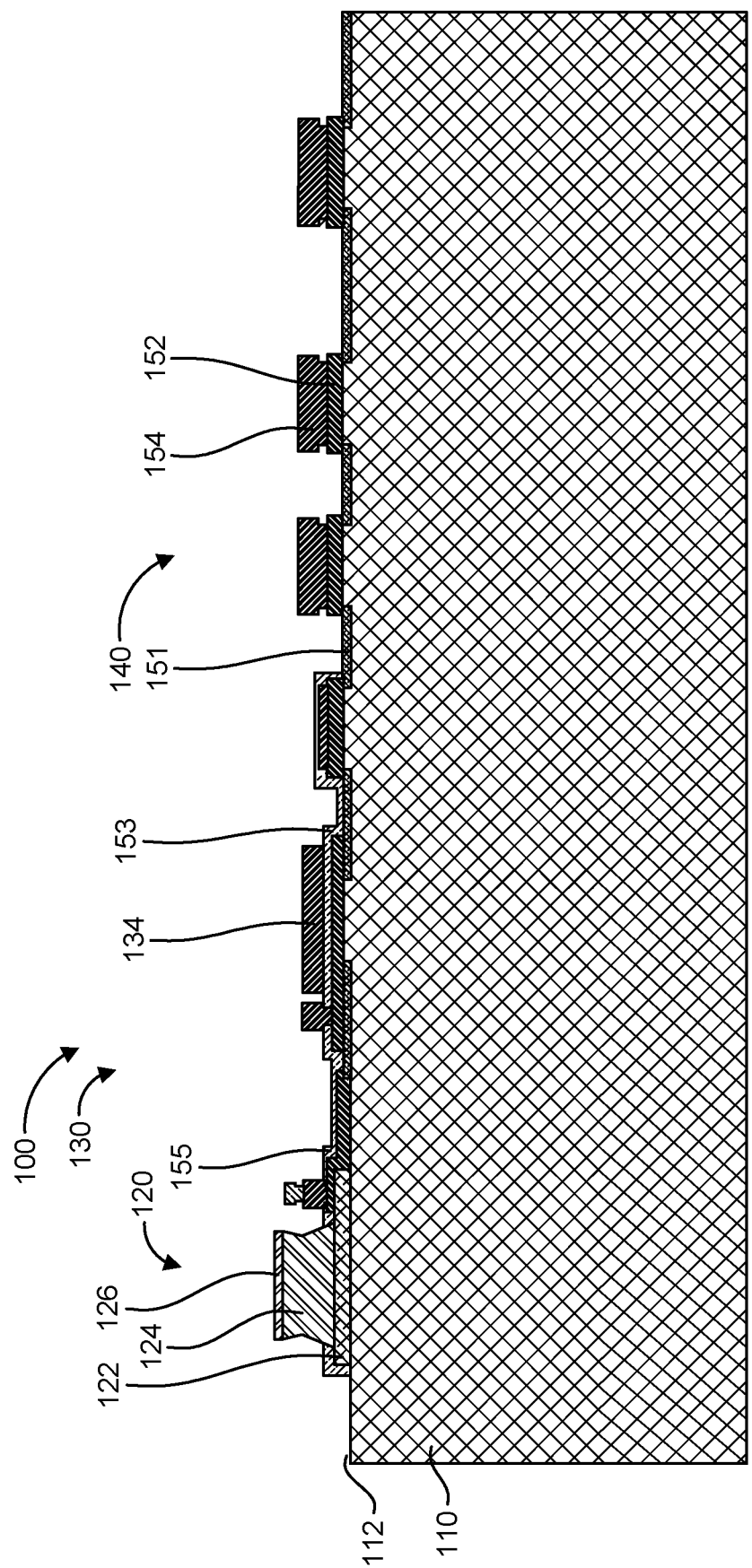

FIG. 4B illustrates a stage in which one or more first upper insulators 153 and one or more second upper conductors 154 may be formed. As seen, the first upper insulating layer 453 may be patterned to form the first upper insulators 153 on some of the first upper conductors 153. Also, the second upper conductors 154 may be formed, e.g., by depositing and patterning a second upper conductive layer. Some of the second upper conductors 154 may contact their corresponding first upper conductors 152 and other second upper conductors 154 may have first upper insulators 153 in between their corresponding first upper conductors 152 (e.g., in the area where the MIM capacitor 130 is formed). That is, the second upper conductors 154 may be disposed on or over their first upper conductors 152.

Figure 4C:
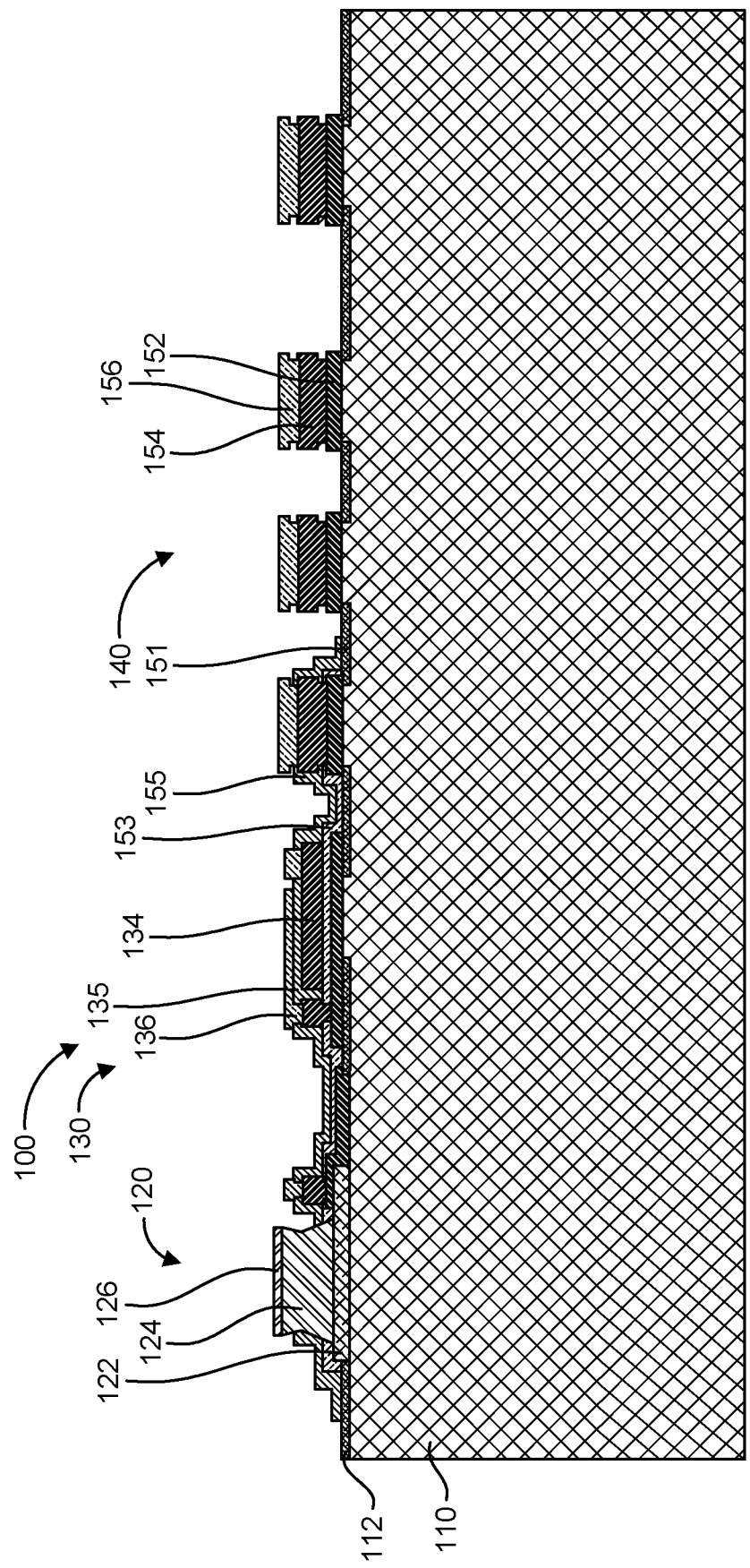

FIG. 4C illustrates a stage in which one or more second upper insulators 155 and one or more third upper conductors 156 may be formed. To form the second upper insulators 155, a second upper insulating layer may be deposited and patterned. The second upper insulators 155 may be disposed on or over the first upper insulators 153. Where the MIM capacitor 120 is formed, one of the second upper insulators 155, configured to serve as the dielectric 135, may be disposed on the second upper conductor 154 serving as the lower plate 134.

To form the third upper conductors 156, a third upper conductive layer may be deposited and patterned. The third upper conductors 156 may be disposed on or over the second upper conductors 154. Where the MIM capacitor 120 is formed, one of the third upper conductors 156, configured to serve as the upper plate 136, may be disposed on the second upper insulator 155 serving as the dielectric 135.

Figure 4D:
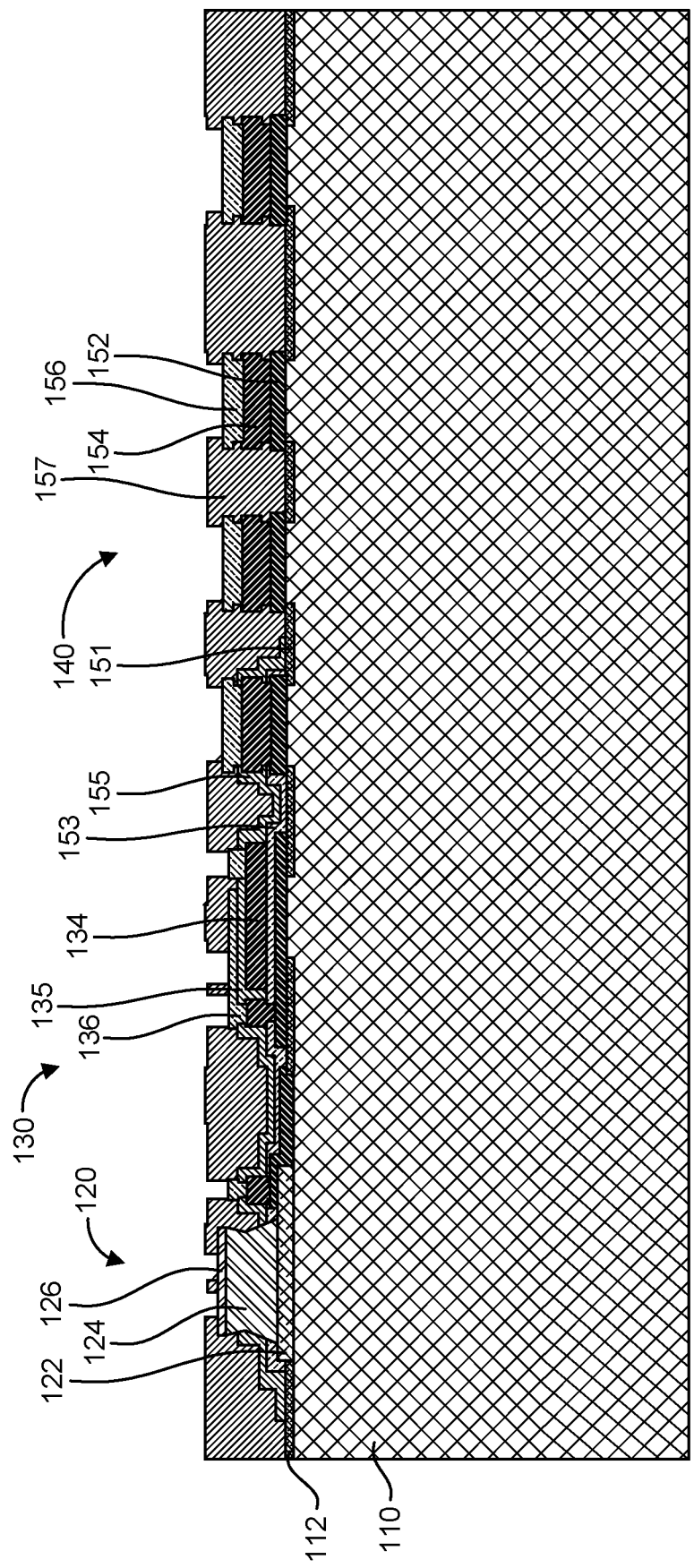

FIG. 4D illustrates a stage in which one or more third upper insulators 157 may be formed. To form the third upper insulators 157, a third upper insulating layer may be deposited and patterned. The third upper insulating layer may be an interlayer dielectric (ILD) such as polyimide. The third upper insulating layer may be patterned to expose upper surfaces of the third upper conductors 156.

Figure 4E:
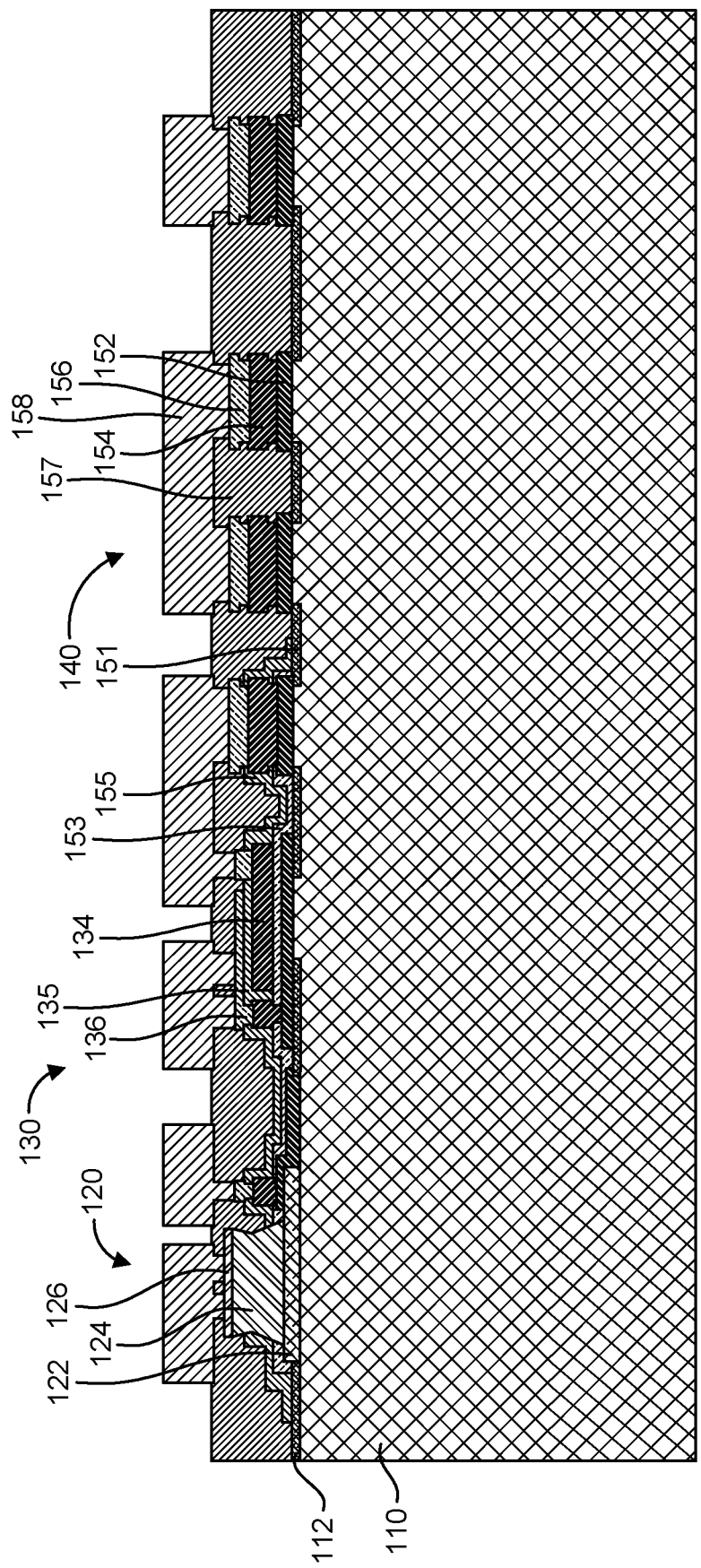

FIG. 4E illustrates a stage in which one or more fourth upper conductors 158 may be formed. To form the fourth upper conductors 158, a fourth conductive layer may be deposited and patterned. For example, a very thick layer of copper (Cu) may be deposited and patterned. The fourth upper conductors 158 may be disposed on the third upper conductors 156 so as to provide electrical coupling among the components within the upper conductive structure 150. Thus, the fourth upper conductors 158 may be viewed as serving the role of the upper RDL 180.

Figure 4F:
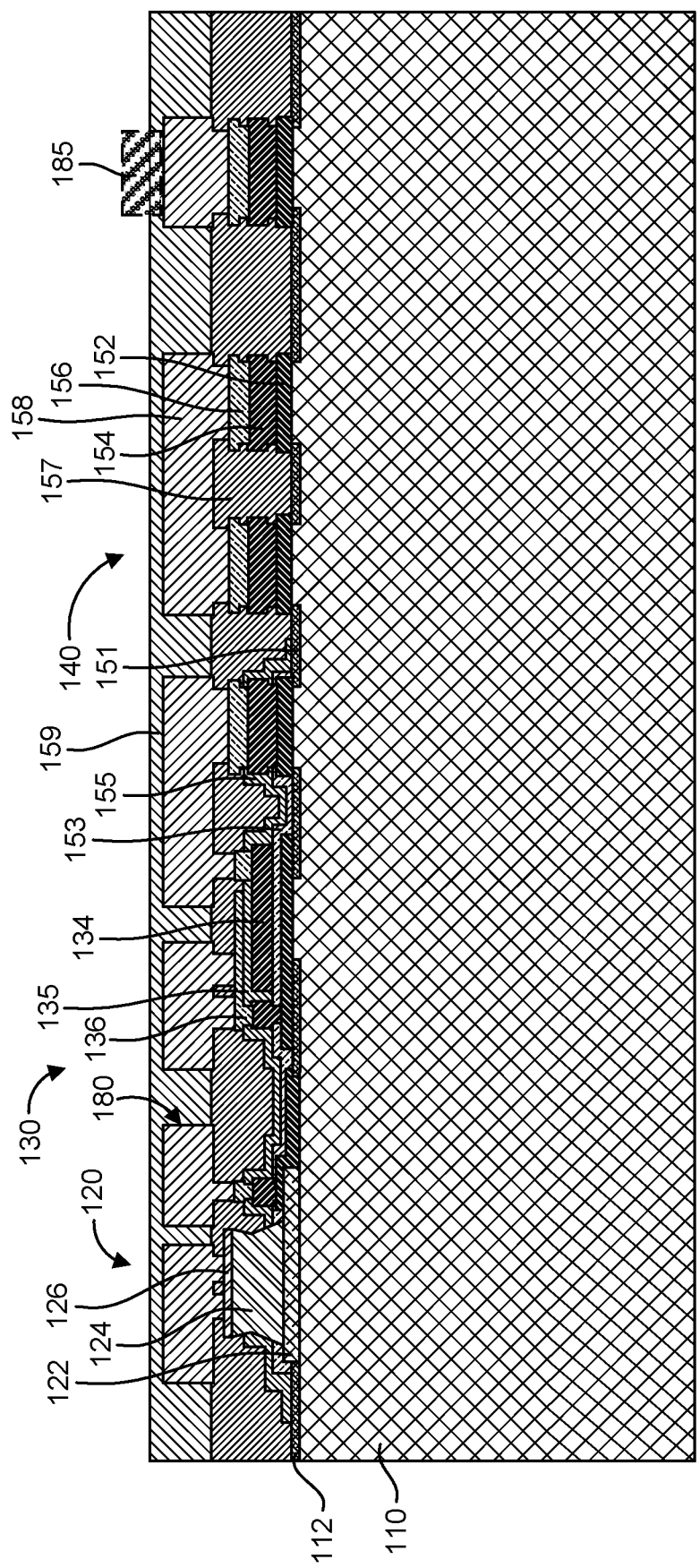

FIG. 4F illustrates a stage in which the tunable filter components—e.g., GaAs varactor 120, MIM capacitor 130, 3D inductor 140, etc.—may be passivated. For example, a fourth upper insulating layer may be deposited and patterned to form one or more fourth upper insulators 159 to encapsulate the fourth upper conductors 158.

To provide connectivity to external components such as the RFFE devices 210, 220, 230, 240, upper surfaces of some of the fourth upper conductors 158 may be left exposed, and one or more contact pads 185 may be formed on the exposed fourth upper conductors 158.

Figure 5A:
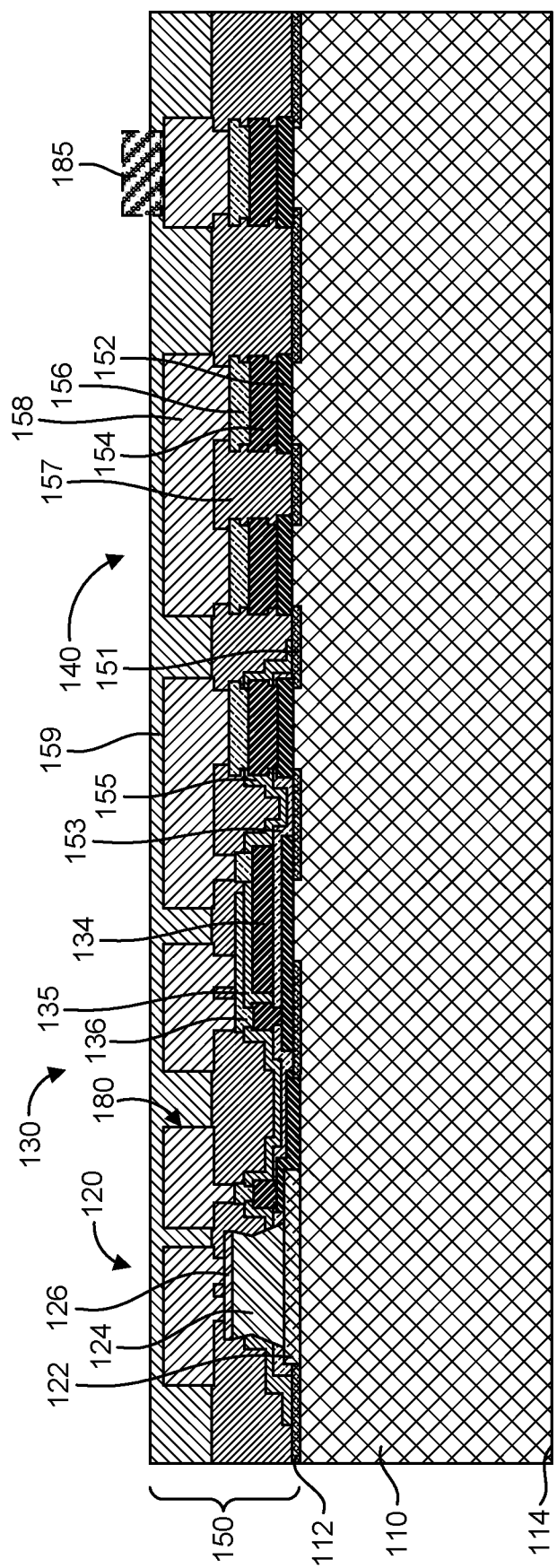

FIG. 5A illustrates a stage in which the GaAs substrate 110 may be brought to a desired height. For example, a backgrind process may be performed on a back side of the GaAs substrate 110, which is the side opposite the upper surface 112.

Figure 5B:
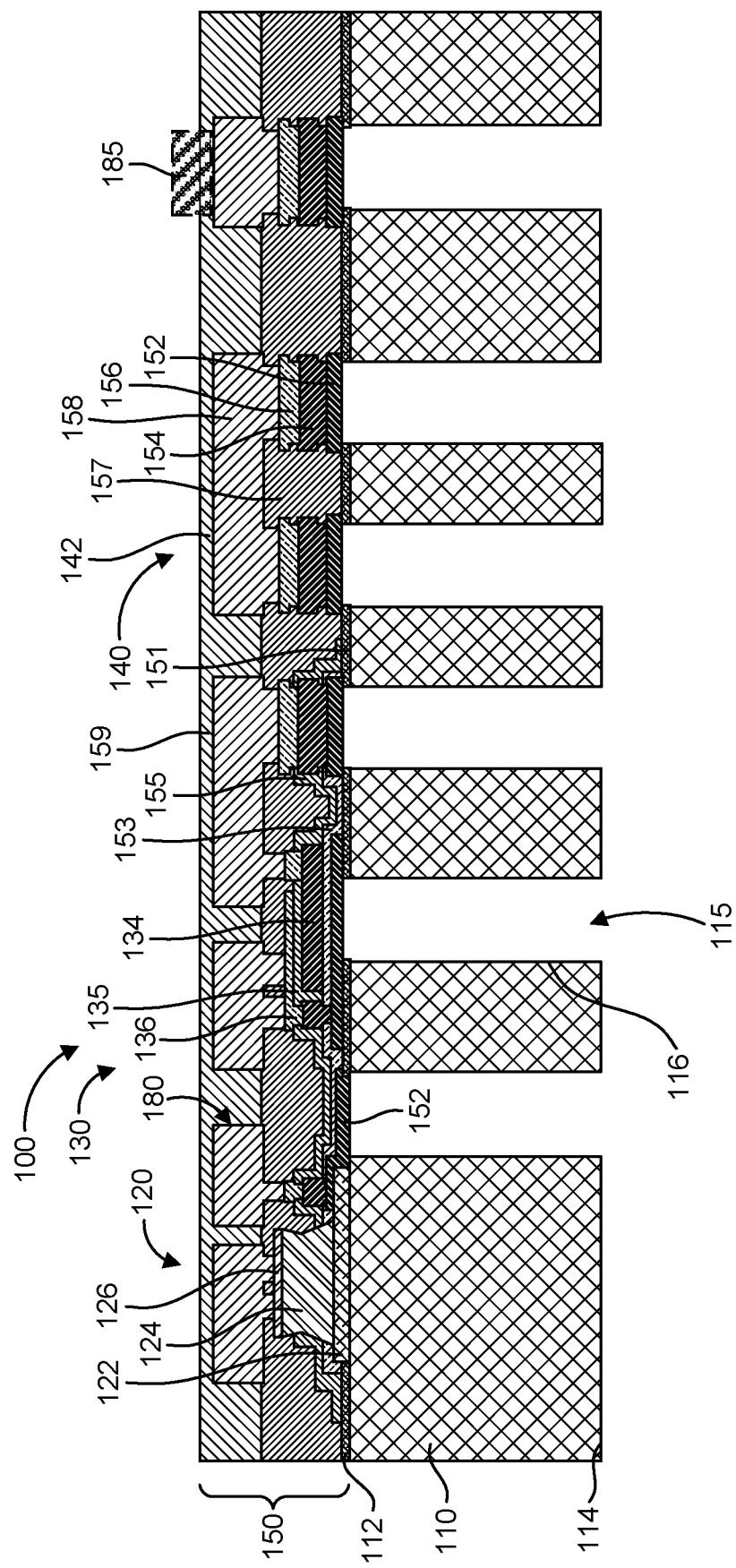

FIG. 5B illustrates a stage in which the GaAs substrate 110 may be etched to form the vias 115, i.e., holes, within the GaAs substrate. For example, a deep reactive ion etching (DRIE) may be performed. The first upper conductors 151 may be used as etch stops. That is, the first upper conductors 151 of the upper conductive structure 150 may be exposed.

Figure 5C:
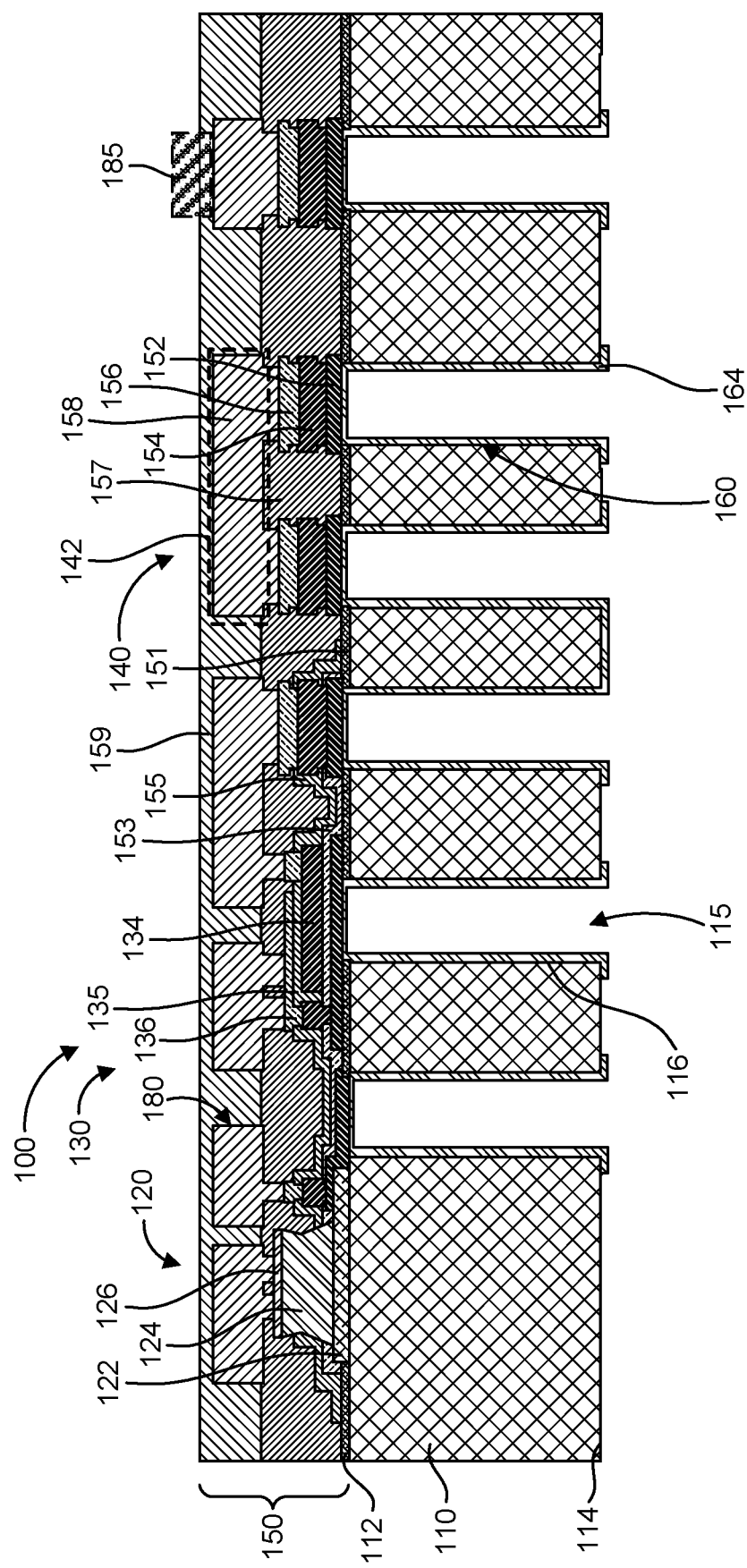

FIG. 5C illustrates a stage in which the conductive layer 164 may be formed on the walls 116 of the vias 115, on the exposed first upper conductors 152, and on some portions of the lower surface 114 of the GaAs substrate 110. For example, the conductive layer 164 may be plated. As indicated above, the conductive layer 164 may be optional.

Figure 5D:
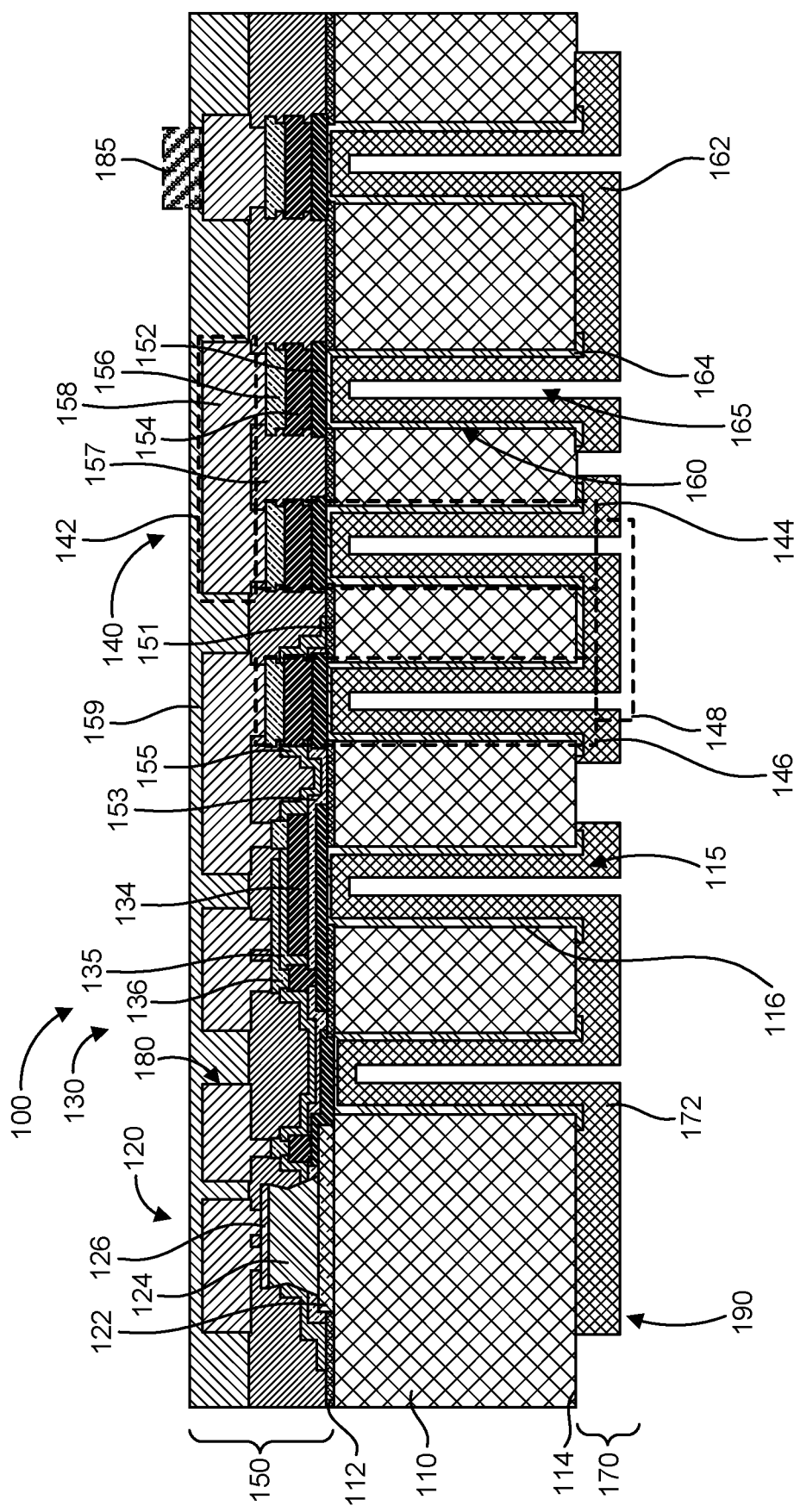

FIG. 5D illustrates a stage in which the conductive pillars 162 and the lower RDL 190 (which comprises the lower conductors 172) may be formed. For example, a thick metal layer (e.g., Cu) may be deposited and patterned. The metal layer may be deposited and patterned such that the central cavities 165 are formed within the conductive pillars 162. When the lower conductors 172 are formed, this may complete the loops of the 3D inductors 140.

Figure 5E:
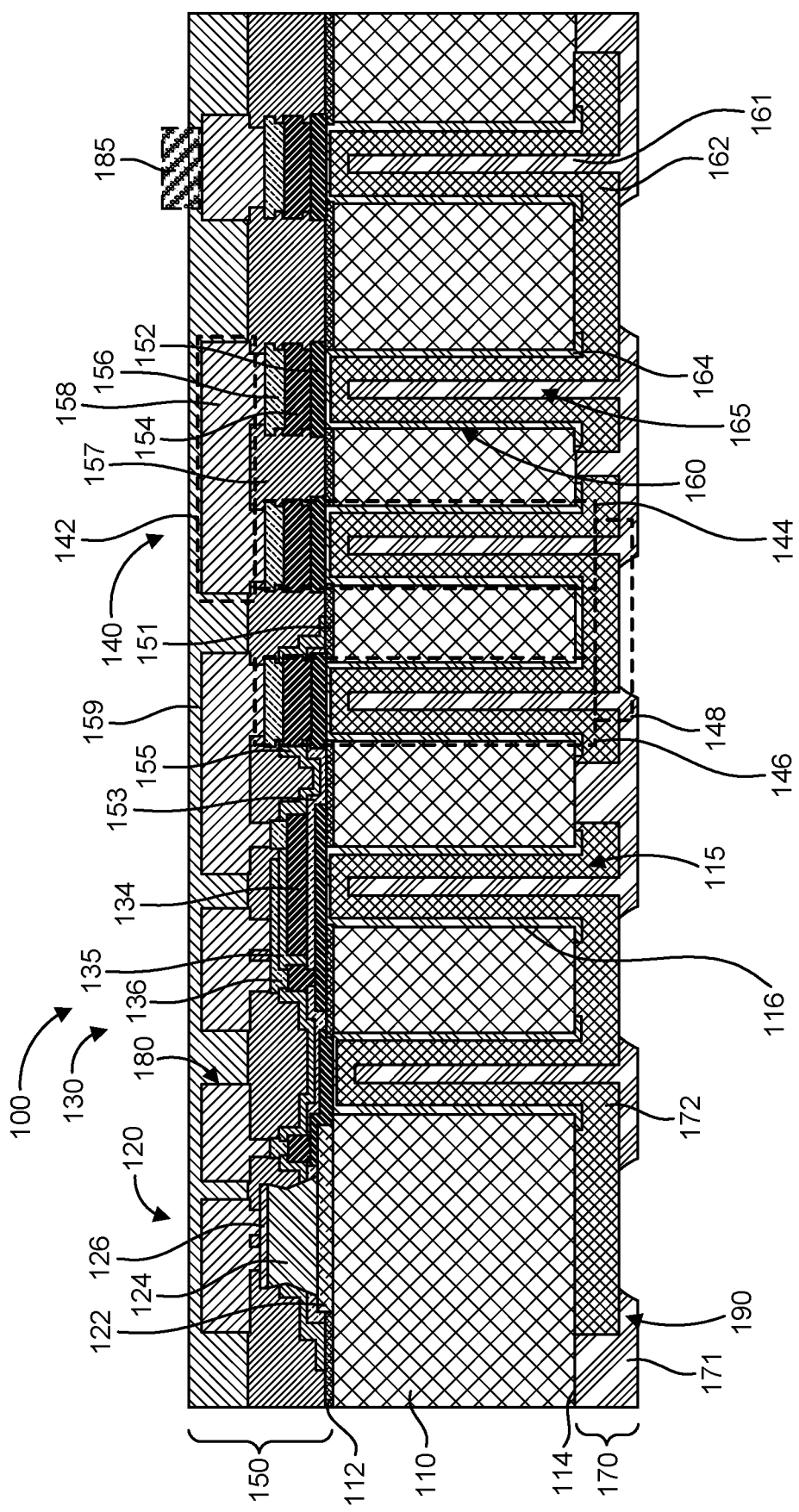

FIG. 5E illustrates a stage in which the lower RDL 190 (the lower conductors 172) may be passivated. For example, a lower insulating layer may be deposited and patterned to form one or more lower insulators 171 disposed on the lower surface 112 of the GaAs substrate 110 and on the lower RDL 190. The lower insulating layer may also be patterned to form the insulating plugs 161 filling the central cavities 165.

Figure 5F:
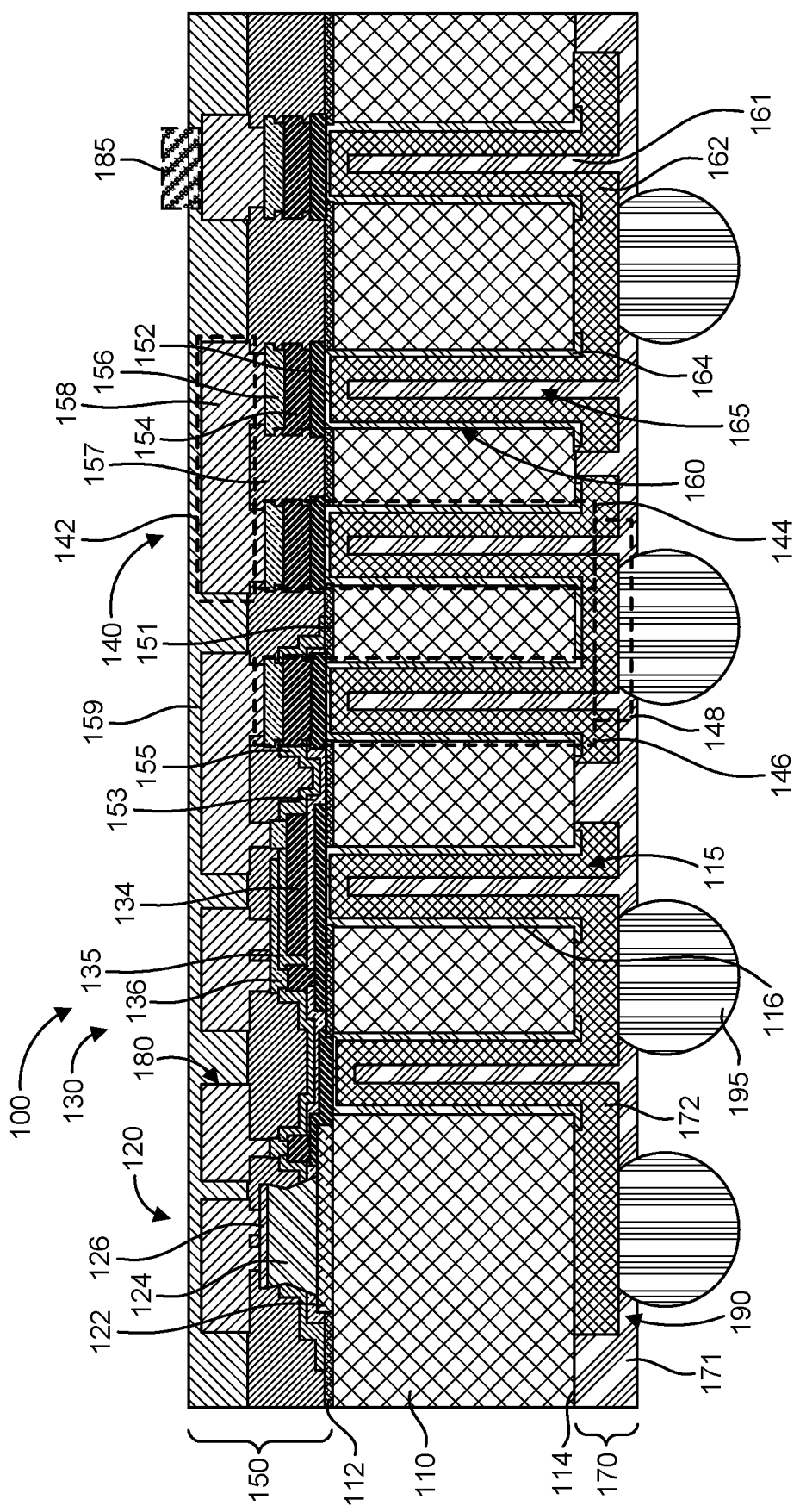

FIG. 5F illustrates a stage in which one or more external connects 195 may be formed. To provide external connectivity, lower surfaces of some lower conductors 172 may be left exposed, and the one or more external connects 195 may be formed on the exposed lower conductors 172.

Figure 6:
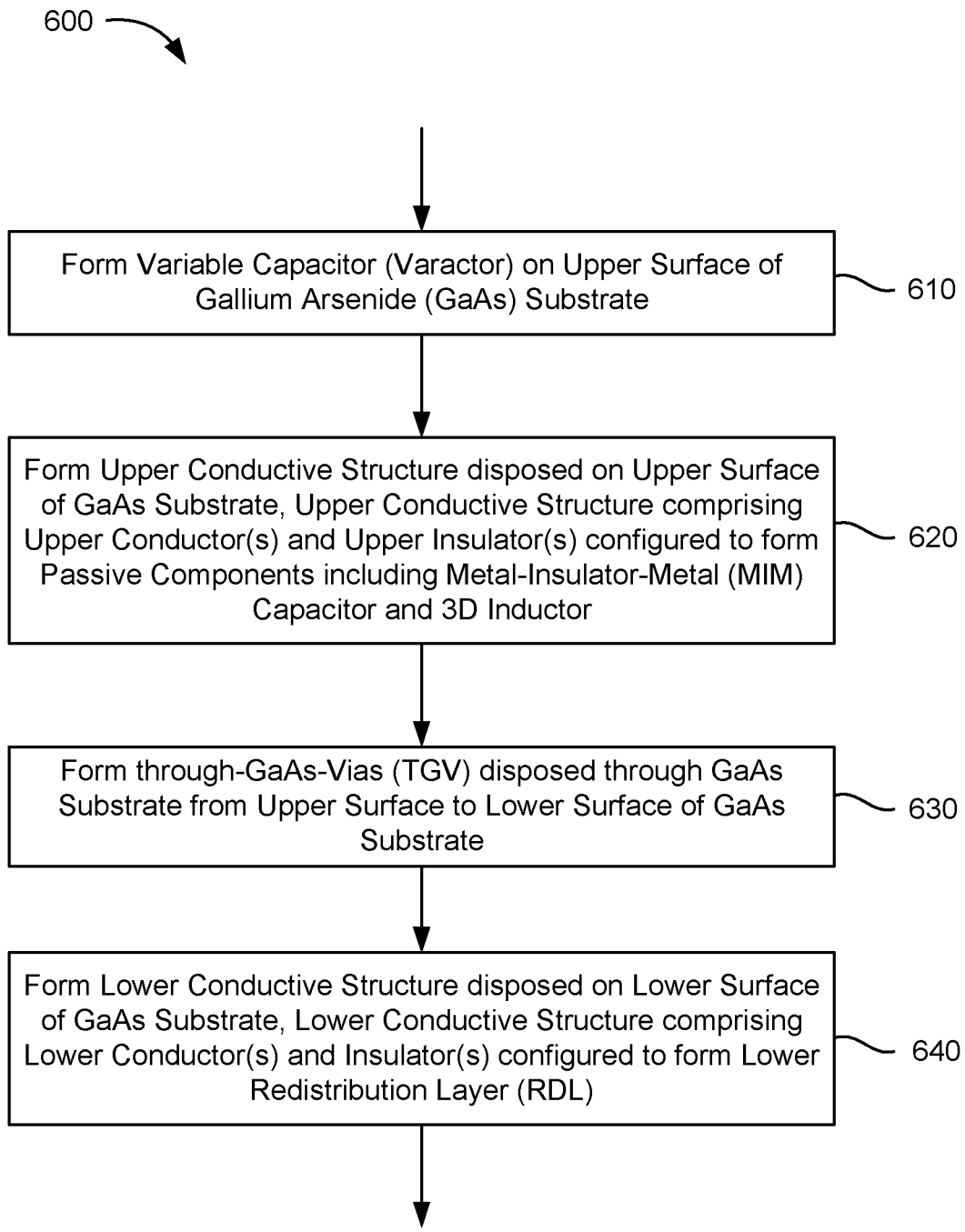
FIGS. 6-9 illustrate flow charts of an example method of manufacturing a tunable filter in accordance with at one or more aspects of the disclosure.

FIG. 6 illustrates a flow chart of an example method 600 of fabricating a tunable filter, such as the tunable filter 100. In block 610, a GaAs varactor 120 may be formed on the upper surface of the GaAs substrate 110.

Figure 7:
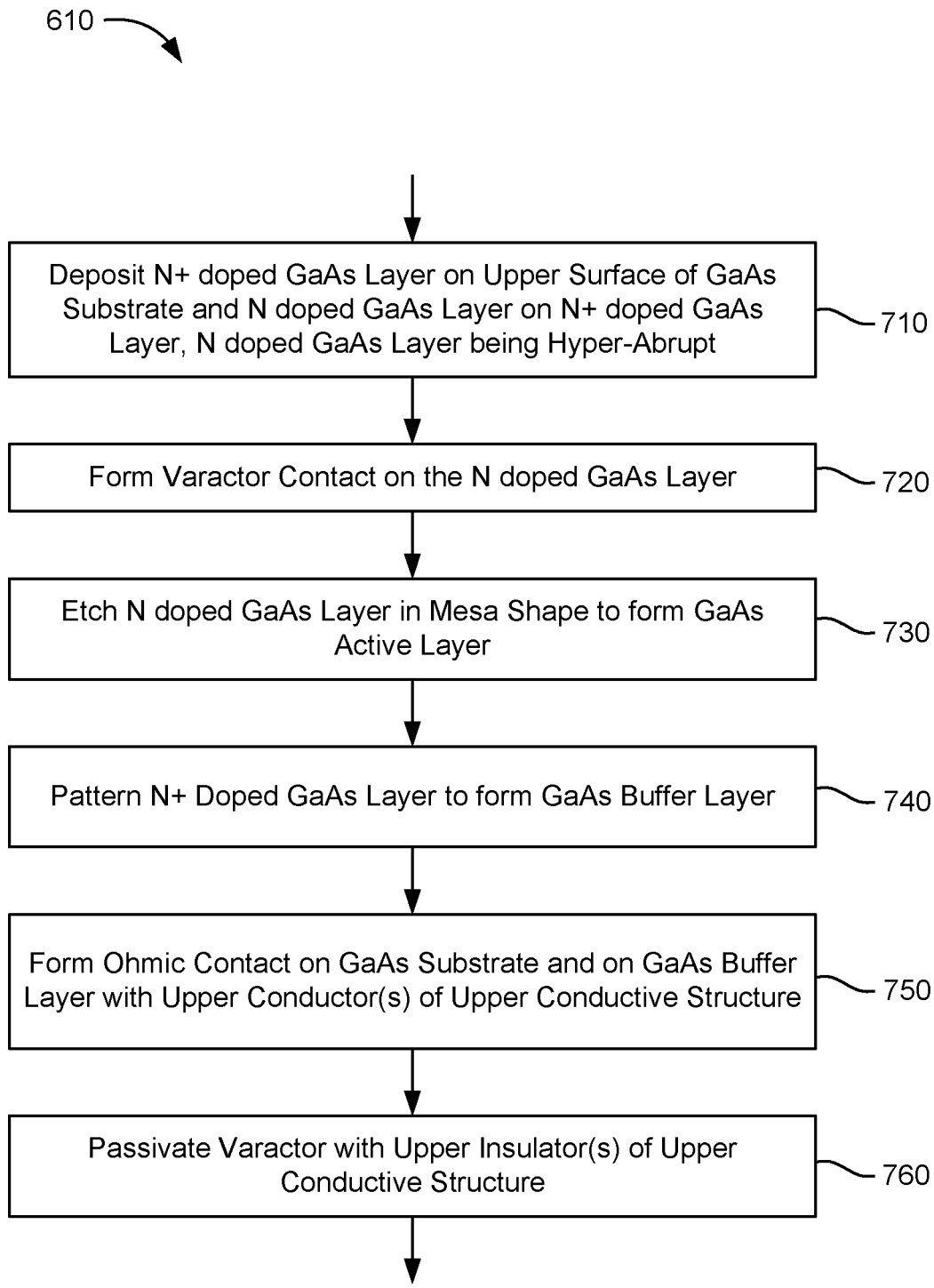

FIG. 7 illustrates a flow chart of an example process to implement block 610. In block 710, an n+ doped GaAs layer 322 may be deposited on the upper surface 112 of the GaAs substrate 110 and an n doped GaAs layer 324 may be deposited on the n+ doped GaAs layer 322. The n doped GaAs layer 324 may be hyper-abrupt. Block 710 may correspond to FIG. 3A.

In block 720, the varactor contact 126 may be formed on the n doped GaAs layer 324. Block 720 may correspond to FIG. 3B.

In block 730, the n doped GaAs layer 324 may be etched, e.g., in a mesa shape, to form the GaAs active layer 124. Block 730 may correspond to FIG. 3C.

In block 740, the n+ doped GaAs layer 322 may be patterned to form the GaAs buffer layer 122. Block 740 may correspond to FIG. 3D.

In block 750, an ohmic contact may be formed on the GaAs substrate 110 and on the GaAs buffer layer 122. For example, one of the first upper conductors 152 of the upper conductive structure 150 may be formed as the ohmic contact. Block 750 may correspond to FIG. 3E or 3F.

In block 760, the GaAs varactor 120 may be passivated with one or more of the upper insulators of the upper conductive structure 150. For example, first and second upper insulators 153, 155 may be used for passivation. Block 760 may correspond to FIG. 3G.

Referring back to FIG. 6, in block 620, the upper conductive structure 150 may be formed to be disposed on the upper surface 112 of the GaAs substrate 110. The upper conductive structure 150 may comprise one or more upper conductors and one or more upper insulators configured to form one or more passive components including the MIM capacitor 130 and the 3D inductor 140.

Figure 8:
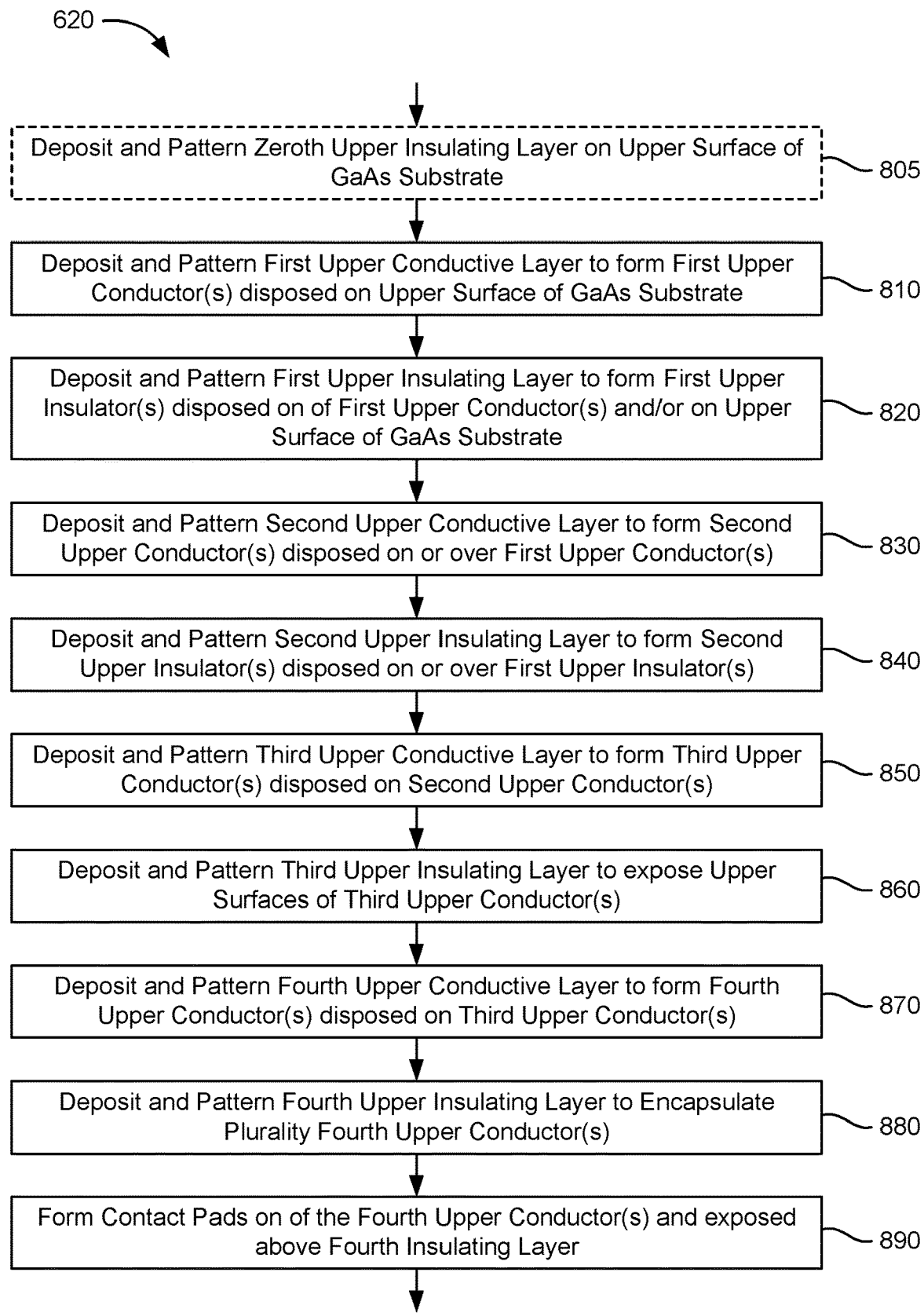

FIG. 8 illustrates a flow chart of an example process to implement block 620. In block 805, the zeroth upper insulating layer may be deposited and patterned to form the one or more zeroth upper insulators 151. Block 805 may correspond to FIG. 3F. Since the zeroth upper insulators 151 are optional, block 805 may also be optional.

In block 810, a first upper conductive layer may be deposited and patterned to form one or more first upper conductors 152 disposed on the upper surface 112 of the GaAs substrate 110. In block 820, a first upper insulating layer may be deposited and patterned to form one or more first upper insulators 153 disposed on one or more of the first upper conductors 152 and/or on the upper surface of the GaAs substrate. Blocks 810 and 820 may correspond to FIGS. 4A and 4B.

In block 830, a second upper conductive layer may be deposited and patterned to form one or more second upper conductors 154 disposed on or over the one or more first upper conductors 152. Block 830 may correspond to FIG. 4B.

In block 840, a second upper insulating layer may be deposited and patterned to form one or more second upper insulators 155 disposed on or over the one or more first upper insulators 153. In block 850, a third upper conductive layer may be deposited and patterned to form the one or more third upper conductors 156 disposed on the one or more second upper conductors 152. Note that after block 850, the MIM capacitor 130—the lower and upper plates 134, 136 and the dielectric 135—is formed. Blocks 840 and 850 may correspond to FIG. 4C.

In block 860, a third upper insulating layer may be deposited and patterned to form one or more third upper insulators 157 configured to expose upper surfaces of the one or more third upper conductors 156. Block 860 may correspond to FIG. 4D In block 870, a fourth upper conductive layer may be deposited and patterned to form one or more fourth upper conductors 158 disposed on the one or more third upper conductors 156. Block 870 may correspond to FIG. 4E.

In block 880, a fourth upper insulating layer may be deposited and patterned to form one or more fourth upper insulators 159 configured to encapsulate the plurality fourth upper conductors 158. In block 890, one or more contact pads 185 may be formed on one or more of the fourth upper conductors 158. Blocks 880 and 890 may correspond to FIG. 4F.

Referring back to FIG. 6, in block 630, one or more TGVs 160 may be formed through the GaAs substrate 110 the upper surface 112 to the lower surface 114 of the GaAs substrate 110. In block 640, the lower conductive structure 170 disposed on the lower surface 114 of the GaAs substrate 110. The lower conductive structure 170 may comprise one or more lower conductors 172 and one or more lower insulators 171 configured to form the lower RDL 190.

Figure 9:
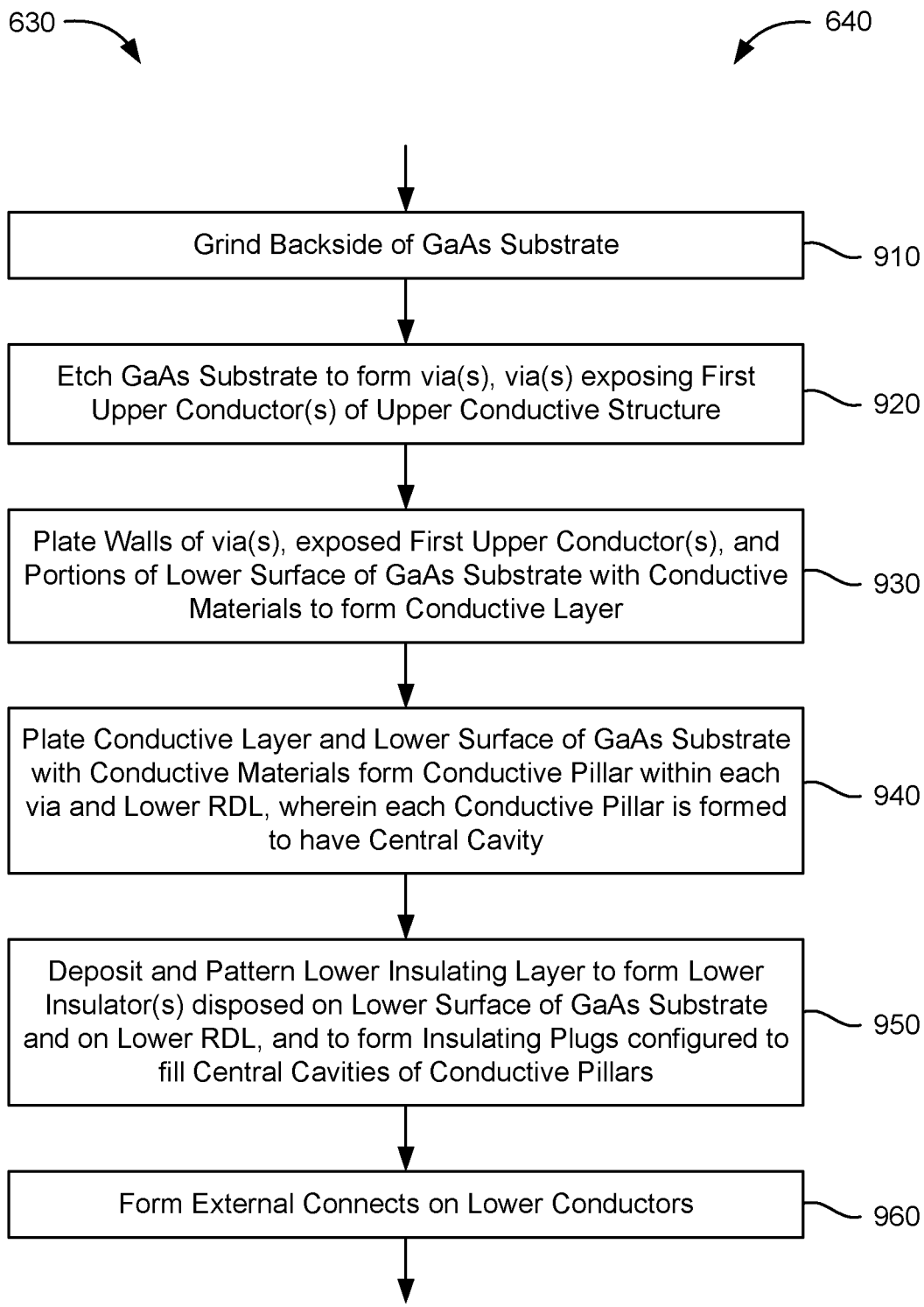

FIG. 9 illustrates a flow chart of an example process to implement blocks 630 and 640. In block 910, the backside of the GaAs substrate 110 may be grinded so that the GaAs substrate 110 is of desired height or thickness, e.g., 50-100 μm. Block 910 may correspond to FIG. 5A.

In block 920, the GaAs substrate 110 may be etched, e.g., through DRIE, to form one or more vias 115. The vias 115 may expose one or more first upper conductors 152 of the upper conductive structure 150. Block 920 may correspond to FIG. 5B.

In block 930, the walls 116 of the vias 115, the exposed first upper conductors 152, and portions of the lower surface 114 of the GaAs substrate 110 may be thinly plated with conductive materials (e.g., Au) form the conductive layer 164. Block 930 may correspond to FIG. 5C.

In block 940, the conductive layer 164 and the lower surface 114 of the GaAs substrate 110 may be thickly plated with conductive materials form a conductive pillar 162 within each via 115 and to form the lower conductors 172 (the lower RDL 190). Each conductive pillar 162 may be formed to have the central cavity 165. Block 940 may correspond to FIG. 5D.

In block 950, a lower insulating layer may be deposited and patterned to form the one or more lower insulators 171 disposed on the lower surface 114 of the GaAs substrate 110 and on the lower RDL 190. In so doing, the insulating plugs 161 configured to fill central cavities 165 of the conductive pillars 162 may be formed. Block 950 may correspond to FIG. 5E.

In block 960, one or more external connects 195 may be formed on one or more lower conductors 172. Block 960 may correspond to FIG. 5F.

It will be appreciated that the foregoing fabrication processes and related discussion were provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the MIM capacitors and/or inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 10:
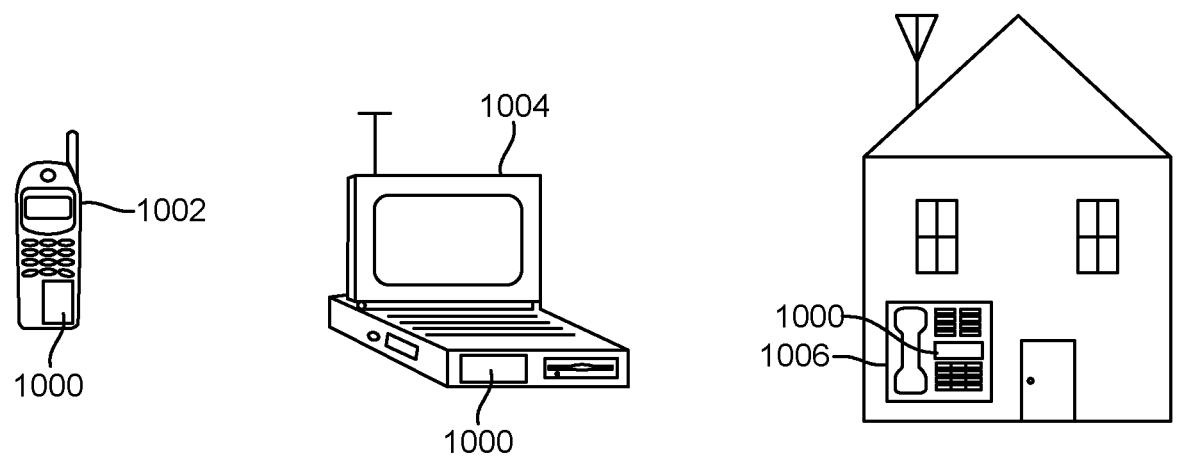
FIG. 10 illustrates various electronic devices which may utilize one or more aspects of the disclosure.

FIG. 10 illustrates various electronic devices that may be integrated with any of the aforementioned antenna on glass devices in accordance with various aspects of the disclosure. For example, a mobile phone device 1002, a laptop computer device 1004, and a fixed location terminal device 1006 may each be consider generally user equipment (UE) and may include the tunable filter 100 as described herein. The devices 1002, 1004, 1006 illustrated in FIG. 10 are merely exemplary. Other electronic devices may also include the tunable filter 100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

The following provides an overview of examples of the present disclosure:

Example 1: A tunable filter, comprising: a gallium arsenide (GaAs) substrate; a variable capacitor (varactor) disposed on an upper surface of the GaAs substrate; an upper conductive structure disposed on the upper surface of the GaAs substrate, the upper conductive structure comprising one or more upper conductors and one or more upper insulators configured to form one or more passive components including a metal-insulator-metal (MIM) capacitor and a 3D inductor; one or more through-GaAs-vias (TGV) disposed through the GaAs substrate from the upper surface to a lower surface of the GaAs substrate; and a lower conductive structure disposed on the lower surface of the GaAs substrate, the lower conductive structure comprising one or more lower conductors and one or more lower insulators configured to form a lower redistribution layer (RDL), wherein the varactor, the MIM capacitor, and the 3D inductor are electrically coupled to form a radio frequency (RF) filter circuit.

Example 2: The tunable filter of example 1, wherein the lower RDL is configured to electrically couple at least one TGV with at least one other TGV.

Example 3: The tunable filter of example 2, further comprising one or more external connects configured to electrically couple the lower RDL to one or more components that are external to the tunable filter.

Example 4: The tunable filter of example 3, wherein the one or more external connects are one or more of wafer-level-package (WLP) balls, copper (Cu) pillars, and solder bumps.

Example 5: The tunable filter of examples 1 through 4, wherein one or more of the TGVs are configured to electrically couple one or more of the varactor, the MIM capacitor, and the 3D inductor with the lower RDL.

Example 6: The tunable filter of example 5, wherein each TGV comprises a conductive pillar disposed to fill a via of the GaAs substrate, the conductive pillar extending from the upper surface to the lower surface of the GaAs substrate within the via.

Example 7: The tunable filter of example 6, wherein the conductive pillar is formed from any one or more of copper (Cu), silver (Ag), gold (Au), aluminum (Al), tungsten (W), nickel (Ni), or combinations thereof.

Example 8: The tunable filter of examples 6 through 7, wherein the conductive pillar and the lower RDL are formed from same one or more conductive materials.

Example 9: The tunable filter of examples 6 through 8, wherein each TGV further comprises a conductive layer disposed vertically on a wall of the GaAs substrate such that the conductive pillar is disposed on and interior of the conductive layer within the via.

Example 10: The tunable filter of example 9, wherein the conductive layer of a TGV is disposed horizontally in between a corresponding conductive pillar and a first upper conductor of the upper conductive structure, and/or wherein the conductive layer of a same or different TGV is disposed horizontally in between the lower surface of the GaAs substrate and the lower RDL.

Example 11: The tunable filter of examples 6 through 10, wherein each TGV further comprises an insulating plug configured to fill a central cavity within the conductive pillar, the insulating plug extending from below the lower surface to below the upper surface of the GaAs substrate.

Example 12: The tunable filter of example 11, wherein the insulating plug and the one or more insulators of the lower conductive structure are formed from same one or more insulating materials.

Example 13: The tunable filter of examples 1 through 12, wherein the lower RDL of the lower conductivity structure is disposed on the lower surface of the GaAs substrate, and wherein the one or more insulators of the lower conductivity structure are disposed on the lower surface of the GaAs substrate and on the lower RDL.

Example 14: The tunable filter of example 13, wherein the one or more lower insulators are formed from any one or more of silicon dioxide ($SiO_2$), an organic polymeric dielectric, polyimide (PI), polynorbornene, benzocyclobutene (BCB), polytetrafluoroethylene (PTFE), Polybenzoxazoles (PBO), or silicone based polymeric dielectrics.

Example 15: The tunable filter of examples 13 through 14, further comprising: one or more external connects disposed on a lower surface of the lower RDL and configured to electrically couple the lower RDL to one or more components that are external to the tunable filter, wherein the one or more lower insulators are configured to encapsulate the one or more external connects other than portions of the lower surface of the lower RDL on which the one or more external connects are disposed.

Example 16: The tunable filter of examples 1 through 15, wherein the varactor is a hyper-abrupt (HA) varactor.

Example 17: The tunable filter of example 16, wherein the varactor comprises: a GaAs buffer layer disposed on the upper surface of the GaAs substrate, the GaAs buffer layer being n+ doped; a GaAs active layer disposed on the GaAs buffer layer, the GaAs active layer being n doped and hyper-abrupt; and a varactor contact disposed on the GaAs active layer.

Example 18: The tunable filter of example 17, wherein the GaAs active layer is mesa shaped.

Example 19: The tunable filter of examples 16 through 18, wherein the one or more upper insulating layers of the upper conductive structure encapsulate the varactor at least in part.

Example 20: The tunable filter of examples 1 through 19, wherein the upper conductive structure comprises: one or more first upper conductors disposed on the one or more TGVs; one or more second upper conductors disposed on or over the one or more first upper conductors; one or more third upper conductors disposed on or over the one or more second upper conductors; one or more fourth upper conductors disposed on the one or more third upper conductors; one or more first upper insulators disposed on one or more of the first upper conductors; and one or more second upper insulators disposed on one or more of the first upper conductors and on one or more of the first upper insulators.

Example 21: The tunable filter of example 20, wherein the first upper conductors, the second upper conductors, the third upper conductors, and/or the fourth upper conductors are formed from any one or more of copper (Cu), silver (Ag), gold (Au), aluminum (Al), or combinations thereof.

Example 22: The tunable filter of examples 20 through 21, wherein one of the first upper conductors is configured to electrically couple a GaAs buffer layer of the varactor with one of the TGVs.

Example 23: The tunable filter of example 22, wherein one of the fourth upper conductors is electrically coupled to a varactor contact of the varactor and another one of the fourth upper conductors is electrically coupled to the GaAs buffer layer of the varactor.

Example 24: The tunable filter of examples 20 through 23, wherein the MIM capacitor comprises: a lower plate; an upper plate; and a dielectric disposed in between the lower and upper plates—wherein one of the second upper conductors serves as the lower plate, one of the second upper insulating layers serves as the dielectric, and one of the third upper conductors serves as the upper plate.

Example 25: The tunable filter of example 24, wherein one of the lower plate and the upper plate is electrically coupled to one of the varactor and the 3D inductor, and the other of the lower plate and the upper plate is electrically coupled to the other of the varactor and the 3D inductor.

Example 26: The tunable filter of examples 24 through 25, wherein the lower plate does not contact any of the first upper conductors.

Example 27: The tunable filter of examples 20 through 26, wherein the 3D inductor comprises one or more loops, each loop comprising: an upper horizontal loop segment; first and second vertical loop segments; and a lower horizontal loop segment, wherein the upper horizontal loop segment comprises one of the fourth upper conductors, the first vertical loop segment comprises one of the TGVs, the second vertical loop segment comprises another one of the TGVs, and the lower horizontal loop segment comprises one of the lower conductors.

Example 28: The tunable filter of examples 20 through 27, wherein the upper conductive structure further comprises: a first insulating layer patterned to form one or more third upper insulators disposed on or over the GaAs substrate to encapsulate the first, second, and third upper conductors; and a second insulating layer patterned to form one or more fourth upper insulators disposed on the one or more fourth upper conductors and on the one or more third upper insulators, wherein the second insulating layer completely covers upper surfaces of the fourth upper conductors electrically coupled to the MIM capacitor and of the fourth upper conductors that form the 3D inductor.

Example 29: The tunable filter of example 28, wherein the first upper insulators, the second upper insulators, the third upper insulators, and/or the fourth upper insulators are from any one or more of silicon dioxide (SiO$_2$), an organic polymeric dielectric, polyimide (PI), polynorbornene, benzocyclobutene (BCB), polytetrafluoroethylene (PTFE), Polybenzoxazoles (PBO), or silicone based polymeric dielectrics.

Example 30: The tunable filter of examples 28 through 29, further comprising: one or more contact pads disposed on one or more of the fourth upper conductors and exposed above the fourth insulating layer, the one or more contact pads configured to electrically couple one or more of the fourth upper conductors to one or more components that are external to the tunable filter.

Example 31: The tunable filter of examples 20 through 30, wherein the upper conductive structure further comprises: one or more zeroth insulators disposed in between the GaAs substrate and one or more first upper conductors and/or in between the GaAs substrate and the third insulating layer.

Example 32: The tunable filter of examples 1 through 31, wherein the tunable filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Example 33: An apparatus, comprising: a tunable filter; and one or more radio frequency front end (RFFE) devices configured to control the tunable filter when electrically coupled to the tunable filter, wherein the tunable filter comprises: a gallium arsenide (GaAs) substrate; a variable capacitor (varactor) disposed on an upper surface of the GaAs substrate; an upper conductive structure disposed on the upper surface of the GaAs substrate, the upper conductive structure comprising one or more upper conductors and one or more upper insulators configured to form one or more passive components including a metal-insulator-metal (MIM) capacitor and a 3D inductor; one or more through-GaAs-vias (TGV) disposed through the GaAs substrate from the upper surface to a lower surface of the GaAs substrate; and a lower conductive structure disposed on the lower surface of the GaAs substrate, the lower conductive structure comprising one or more lower conductors and one or more lower insulators configured to form a lower redistribution layer (RDL), and wherein the one or more RFFE devices are electrically coupled to any one or more of the varactor, the MIM capacitor, and the 3D inductor through one or more external connects and/or one or more contact pads of the tunable filter.

Example 34: The apparatus of example 33, wherein the one or more RFFE devices are all CMOS devices.

Example 35: The apparatus of examples 33 through 34, wherein the one or more RFFE devices comprise one or more of: a charge pump/controller, a low noise amplifier (LNA), and a switch.

Example 36: The apparatus of example 35, wherein the charge pump/controller, the low noise amplifier (LNA), and the switch are each individually electrically coupled to the tunable filter through the one or more contact pads.

Example 37: The apparatus of examples 35 through 36, wherein functionalities of the charge pump/controller, the low noise amplifier (LNA), and the switch are combined in a single RFFE device.

Example 38: The apparatus of example 37, wherein single RFFE device is configured to electrically couple with multiple tunable filters.

Example 39: A method of fabricating a tunable filter, the method comprising: forming a variable capacitor (varactor) on an upper surface of a GaAs substrate; forming an upper conductive structure disposed on the upper surface of the GaAs substrate, the upper conductive structure comprising one or more upper conductors and one or more upper insulators configured to form one or more passive components including a metal-insulator-metal (MIM) capacitor and a 3D inductor; forming one or more through-GaAs-vias (TGV) through the GaAs substrate from the upper surface to a lower surface of the GaAs substrate; and forming a lower conductive structure disposed on the lower surface of the GaAs substrate, the lower conductive structure comprising one or more lower conductors and one or more lower insulators configured to form a lower redistribution layer (RDL), wherein the varactor, the MIM capacitor, and the 3D inductor are electrically coupled to form a radio frequency (RF) filter circuit.

Example 40: The method of example 39, wherein forming the varactor comprises: depositing an n+ doped GaAs layer on the upper surface of the GaAs substrate and an n doped GaAs layer on the n+ doped GaAs layer, the n doped GaAs layer being hyper-abrupt; forming a varactor contact on the n doped GaAs layer; etching the n doped GaAs layer into a mesa shape to form a GaAs active layer; patterning the n+ doped GaAs layer to form a GaAs buffer layer; forming an ohmic contact on the GaAs substrate and on the GaAs buffer layer with one or more of the upper conductors of the upper conductive structure; and passivating the varactor with one or more of the upper insulators of the upper conductive structure.

Example 41: The method of examples 39 through 40, wherein forming the upper conductive structure comprises: depositing and patterning a first upper conductive layer to form one or more first upper conductors disposed on the upper surface of the GaAs substrate; depositing and patterning a first upper insulating layer to form one or more first upper insulators disposed on one or more of the first upper conductors and/or on the upper surface of the GaAs substrate; depositing and patterning a second upper conductive layer to form one or more second upper conductors disposed on or over the one or more first upper conductors; depositing and patterning a second upper insulating layer to form one or more second upper insulators disposed on or over the one or more first upper insulators; depositing and patterning a third upper conductive layer to form one or more third upper conductors disposed on the one or more second upper conductors; depositing and patterning a third upper insulating layer to form one or more third upper insulators configured to expose upper surfaces of the one or more third upper conductors; depositing and patterning a fourth upper conductive layer to form one or more fourth upper conductors disposed on the one or more third upper conductors; and depositing and patterning a fourth upper insulating layer to form one or more fourth upper insulators configured to encapsulate the one or more fourth upper conductors.

Example 42: The method of example 41, wherein the MIM capacitor comprises: a lower plate; an upper plate; and a dielectric disposed in between the lower and upper plates, wherein one of the second upper conductors serves as the lower plate, one of the second upper insulators serves as the dielectric, and one of the third upper conductors serves as the upper plate.

Example 43: The method of examples 41 through 42, wherein the 3D inductor comprises one or more loops, each loop comprising: an upper horizontal loop segment; first and second vertical loop segments; and a lower horizontal loop segment, wherein the upper horizontal loop segment comprises one of the fourth upper conductors, the first vertical loop segment comprises one of the TGVs, the second vertical loop segment comprises another one of the TGVs, and the lower horizontal loop segment comprises one of the lower conductors.

Example 44: The method of examples 41 through 43, further comprising: forming one or more contact pads on one or more of the fourth upper conductors.

Example 45: The method of examples 39 through 44, wherein forming the one or more TGVs and forming the lower conductive structure comprise: grinding a backside of the GaAs substrate; etching the GaAs substrate to form one or more vias, the one or more vias exposing one or more of the first upper conductors of the upper conductive structure; plating walls of the one or more vias, the exposed one or more of the first upper conductors, and portions of the lower surface of the GaAs substrate with conductive materials to form a conductive layer; plating the conductive layer and the lower surface of the GaAs substrate with conductive materials form a conductive pillar within each via and the lower RDL, wherein each conductive pillar is formed to have a central cavity; and depositing and patterning a lower insulating layer to form one or more of the lower insulators disposed on the lower surface of the GaAs substrate and on the lower RDL, and to form one or more insulating plugs configured to fill central cavities of the conductive pillars, wherein each TGV comprises one of the conductive pillars and the corresponding insulating plug.

Example 46: The method of example 45, wherein forming the one or more TGVs and forming the lower conductive structure further comprise: forming one or more external connects on one or more of the lower conductors.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A tunable filter, comprising:
    a gallium arsenide (GaAs) substrate;
    a variable capacitor (varactor) disposed on an upper surface of the GaAs substrate;
    an upper conductive structure disposed on the upper surface of the GaAs substrate, the upper conductive structure comprising one or more upper conductors and one or more upper insulators configured to form one or more passive components including a metal-insulator-metal (MIM) capacitor and a 3D inductor;
    one or more through-GaAs-vias (TGV) disposed through the GaAs substrate from the upper surface to a lower surface of the GaAs substrate; and
    a lower conductive structure disposed on the lower surface of the GaAs substrate, the lower conductive structure comprising one or more lower conductors and one or more lower insulators configured to form a lower redistribution layer (RDL),
    wherein the varactor, the MIM capacitor, and the 3D inductor are electrically coupled to form a radio frequency (RF) filter circuit, and
    wherein the varactor comprises:
        a GaAs buffer layer disposed on the upper surface of the GaAs substrate, the GaAs buffer layer being n+ doped;
        a GaAs active layer disposed on the GaAs buffer layer, the GaAs active layer being n doped and hyperabrupt; and
        a varactor contact disposed on the GaAs active layer.

2. The tunable filter of claim 1, wherein the lower RDL is configured to electrically couple at least one TGV with at least one other TGV.

3. The tunable filter of claim 2, further comprising:
    one or more external connects configured to electrically couple the lower RDL to one or more components that are external to the tunable filter.

4. The tunable filter of claim 3, wherein the one or more external connects are one or more of wafer-level-package (WLP) balls, copper (Cu) pillars, and solder bumps.

5. The tunable filter of claim 1, wherein one or more of the TGVs are configured to electrically couple one or more of the varactor, the MIM capacitor, and the 3D inductor with the lower RDL.

6. The tunable filter of claim 5, wherein each TGV comprises a conductive pillar disposed to fill a via of the GaAs substrate, the conductive pillar extending from the upper surface to the lower surface of the GaAs substrate within the via.

7. The tunable filter of claim 6, wherein the conductive pillar is formed from any one or more of copper (Cu), silver (Ag), gold (Au), aluminum (Al), tungsten (W), nickel (Ni), or combinations thereof.

8. The tunable filter of claim 6, wherein the conductive pillar and the lower RDL are formed from same one or more conductive materials.

9. The tunable filter of claim 6, wherein each TGV further comprises a conductive layer disposed vertically on a wall of the GaAs substrate such that the conductive pillar is disposed on and interior of the conductive layer within the via.

10. The tunable filter of claim 9,
wherein the conductive layer of a TGV is disposed horizontally in between the corresponding conductive pillar and a first upper conductor of the upper conductive structure, and/or
wherein the conductive layer of a same or different TGV is disposed horizontally in between the lower surface of the GaAs substrate and the lower RDL.

11. The tunable filter of claim 6, wherein each TGV further comprises an insulating plug configured to fill a central cavity within the conductive pillar, the insulating plug extending from below the lower surface to below the upper surface of the GaAs substrate.

12. The tunable filter of claim 11, wherein the insulating plug and the one or more insulators of the lower conductive structure are formed from same one or more insulating materials.

13. The tunable filter of claim 1,
wherein the lower RDL of the lower conductivity structure is disposed on the lower surface of the GaAs substrate, and
wherein the one or more insulators of the lower conductivity structure are disposed on the lower surface of the GaAs substrate and on the lower RDL.

14. The tunable filter of claim 13, wherein the one or more lower insulators are formed from any one or more of silicon dioxide ($SiO_2$), an organic polymeric dielectric, polyimide (PI), polynorbornene, benzocyclobutene (BCB), polytetrafluoroethylene (PTFE), Polybenzoxazoles (PBO), or silicone based polymeric dielectrics.

15. The tunable filter of claim 1 wherein the GaAs active layer is mesa shaped.

16. The tunable filter of claim 1, wherein the tunable filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

17. A tunable filter, comprising:
a gallium arsenide (GaAs) substrate;
a variable capacitor (varactor) disposed on an upper surface of the GaAs substrate;
an upper conductive structure disposed on the upper surface of the GaAs substrate, the upper conductive structure comprising one or more upper conductors and one or more upper insulators configured to form one or more passive components including a metal-insulator-metal (MIM) capacitor and a 3D inductor;
one or more through-GaAs-vias (TGV) disposed through the GaAs substrate from the upper surface to a lower surface of the GaAs substrate; and
a lower conductive structure disposed on the lower surface of the GaAs substrate, the lower conductive structure comprising one or more lower conductors and one or more lower insulators configured to form a lower redistribution layer (RDL),
wherein the varactor, the MIM capacitor, and the 3D inductor are electrically coupled to form a radio frequency (RF) filter circuit, and
wherein the upper conductive structure comprises:
one or more first upper conductors disposed on the one or more TGVs;
one or more second upper conductors disposed on or over the one or more first upper conductors;
one or more third upper conductors disposed on or over the one or more second upper conductors;
one or more fourth upper conductors disposed on the one or more third upper conductors;
one or more first upper insulators disposed on one or more of the first upper conductors; and
one or more second upper insulators disposed on one or more of the first upper conductors and on one or more of the first upper insulators.

18. The tunable filter of claim 17, wherein the first upper conductors, the second upper conductors, the third upper conductors, and/or the fourth upper conductors are formed from any one or more of copper (Cu), silver (Ag), gold (Au), aluminum (Al), or combinations thereof.

19. The tunable filter of claim 17, wherein one of the first upper conductors is configured to electrically couple a GaAs buffer layer of the varactor with one of the TGVs.

20. The tunable filter of claim 19, wherein one of the fourth upper conductors is electrically coupled to a varactor contact of the varactor and another one of the fourth upper conductors is electrically coupled to the GaAs buffer layer of the varactor.

21. The tunable filter of claim 17, wherein the MIM capacitor comprises:
a lower plate;
an upper plate; and
a dielectric disposed in between the lower and upper plates,
wherein one of the second upper conductors serves as the lower plate, one of the second upper insulators serves as the dielectric, and one of the third upper conductors serves as the upper plate.

22. The tunable filter of claim 21, wherein one of the lower plate and the upper plate is electrically coupled to one of the varactor and the 3D inductor, and the other of the lower plate and the upper plate is electrically coupled to the other of the varactor and the 3D inductor.

23. The tunable filter of claim 21, wherein the lower plate does not contact any of the first upper conductors.

24. The tunable filter of claim 17, wherein the 3D inductor comprises one or more loops, each loop comprising:
an upper horizontal loop segment;
first and second vertical loop segments; and
a lower horizontal loop segment,
wherein the upper horizontal loop segment comprises one of the fourth upper conductors, the first vertical loop segment comprises one of the TGVs, the second vertical loop segment comprises another one of the TGVs, and the lower horizontal loop segment comprises one of the lower conductors.

25. The tunable filter of claim 17, wherein the upper conductive structure further comprises:
- one or more third upper insulators disposed on or over the GaAs substrate to encapsulate the first, second, and third upper conductors; and
- one or more fourth upper insulators disposed on the one or more fourth upper conductors and on the one or more third upper insulators,
- wherein the fourth upper insulators completely cover upper surfaces of the fourth upper conductors electrically coupled to the MIM capacitor and of the fourth upper conductors that form the 3D inductor.

26. The tunable filter of claim 25, wherein the first upper insulators, the second upper insulators, the third upper insulators, and/or the fourth upper insulators are from any one or more of silicon dioxide ($SiO_2$), an organic polymeric dielectric, polyimide (PI), polynorbornene, benzocyclobutene (BCB), polytetrafluoroethylene (PTFE), Polybenzoxazoles (PBO), or silicone based polymeric dielectrics.

27. A method of fabricating a tunable filter, the method comprising:
- forming a variable capacitor (varactor) on an upper surface of a GaAs substrate;
- forming an upper conductive structure disposed on the upper surface of the GaAs substrate, the upper conductive structure comprising one or more upper conductors and one or more upper insulators configured to form one or more passive components including a metal-insulator-metal (MIM) capacitor and a 3D inductor;
- forming one or more through-GaAs-vias (TGV) through the GaAs substrate from the upper surface to a lower surface of the GaAs substrate; and
- forming a lower conductive structure disposed on the lower surface of the GaAs substrate, the lower conductive structure comprising one or more lower conductors and one or more lower insulators configured to form a lower redistribution layer (RDL),
- wherein the varactor, the MIM capacitor, and the 3D inductor are electrically coupled to form a radio frequency (RF) filter circuit, and
- wherein forming the varactor comprises:
  - depositing an n+ doped GaAs layer on the upper surface of the GaAs substrate and an n doped GaAs layer on the n+ doped GaAs layer, the n doped GaAs layer being hyper-abrupt; and
  - forming a varactor contact on the n doped GaAs layer.

28. The method of claim 27, wherein forming the upper conductive structure comprises:
- depositing and patterning a first upper conductive layer to form one or more first upper conductors disposed on the upper surface of the GaAs substrate;
- depositing and patterning a first upper insulating layer to form one or more first upper insulators disposed on one or more of the first upper conductors and/or on the upper surface of the GaAs substrate;
- depositing and patterning a second upper conductive layer to form one or more second upper conductors disposed on or over the one or more first upper conductors;
- depositing and patterning a second upper insulating layer to form one or more second upper insulators disposed on or over the one or more first upper insulators;
- depositing and patterning a third upper conductive layer to form one or more third upper conductors disposed on the one or more second upper conductors;
- depositing and patterning a third upper insulating layer to form one or more third upper insulators configured to expose upper surfaces of the one or more third upper conductors;
- depositing and patterning a fourth upper conductive layer to form one or more fourth upper conductors disposed on the one or more third upper conductors; and
- depositing and patterning a fourth upper insulating layer to form one or more fourth upper insulators configured to encapsulate the one or more fourth upper conductors.

29. The method of claim 28, wherein the MIM capacitor comprises:
- a lower plate;
- an upper plate; and
- a dielectric disposed in between the lower and upper plates,
- wherein one of the second upper conductors serves as the lower plate, one of the second upper insulators serves as the dielectric, and one of the third upper conductors serves as the upper plate.

30. The method of claim 28, wherein the 3D inductor comprises one or more loops, each loop comprising:
- an upper horizontal loop segment;
- first and second vertical loop segments; and
- a lower horizontal loop segment,
- wherein the upper horizontal loop segment comprises one of the fourth upper conductors, the first vertical loop segment comprises one of the TGVs, the second vertical loop segment comprises another one of the TGVs, and the lower horizontal loop segment comprises one of the lower conductors that make up the lower RDL.

31. The method of claim 27, wherein forming the one or more TGVs and forming the lower conductive structure comprise:
- grinding a backside of the GaAs substrate;
- etching the GaAs substrate to form one or more vias, the one or more vias exposing one or more first upper conductors of the upper conductive structure;
- plating walls of the one or more vias, the exposed one or more first upper conductors, and portions of the lower surface of the GaAs substrate with conductive materials to form a conductive layer;
- plating the conductive layer and the lower surface of the GaAs substrate with conductive materials to form a conductive pillar within each via and the lower RDL, wherein each conductive pillar is formed to have a central cavity; and
- depositing and patterning a lower insulating layer to form the one or more lower insulators disposed on the lower surface of the GaAs substrate and on the lower RDL, and to form one or more insulating plugs configured to fill the central cavities of the conductive pillars,
- wherein each TGV comprises one of the conductive pillars and the corresponding conductive layer.

32. The method of claim 31, wherein forming the one or more TGVs and forming the lower conductive structure further comprise:
- forming one or more external connects on the one or more lower conductors.

* * * * *